(12) United States Patent
Mehandru et al.

(10) Patent No.: US 11,430,868 B2
(45) Date of Patent: Aug. 30, 2022

(54) BURIED ETCH-STOP LAYER TO HELP CONTROL TRANSISTOR SOURCE/DRAIN DEPTH

(71) Applicant: INTEL CORPORATION, Santa Clara, CA (US)

(72) Inventors: Rishabh Mehandru, Portland, OR (US); Biswajeet Guha, Hillsboro, OR (US); Anupama Bowonder, Portland, OR (US); Anand S. Murthy, Portland, OR (US); Tahir Ghani, Portland, OR (US); Stephen M. Cea, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 917 days.

(21) Appl. No.: 16/020,361

(22) Filed: Jun. 27, 2018

(65) Prior Publication Data

US 2020/0006488 A1 Jan. 2, 2020

(51) Int. Cl.
*H01L 29/10* (2006.01)
*H01L 29/06* (2006.01)
(Continued)

(52) U.S. Cl.
CPC .......... *H01L 29/1083* (2013.01); *H01L 21/74* (2013.01); *H01L 29/0673* (2013.01); *H01L 29/42392* (2013.01); *H01L 29/66742* (2013.01); *H01L 29/66795* (2013.01); *H01L 29/7851* (2013.01); *H01L 29/78696* (2013.01); *H01L 29/16* (2013.01); *H01L 29/161* (2013.01); *H01L 29/20* (2013.01)

(58) Field of Classification Search
CPC . H01L 21/74; H01L 29/1083; H01L 29/0673; H01L 29/42392; H01L 29/66742; H01L 29/66795; H01L 29/7851; H01L 29/78696; H01L 29/16; H01L 29/161; H01L 29/20
USPC ........................................................ 257/347
See application file for complete search history.

(56) References Cited

U.S. PATENT DOCUMENTS

| | | | |
|---|---|---|---|
| 10,134,901 B1* | 11/2018 | Pawlak | ............ H01L 29/66772 |
| 2014/0008700 A1* | 1/2014 | Rachmady | ........ H01L 29/78684 257/192 |

(Continued)

*Primary Examiner* — Tong-Ho Kim
(74) *Attorney, Agent, or Firm* — Schwabe, Williamson & Wyatt P.C.

(57) ABSTRACT

Integrated circuit structures including a buried etch-stop layer to help control transistor source/drain depth are provided herein. The buried etch-stop layer addresses the issue of the source/drain etch (or epi-undercut (EUC) etch) going below the bottom of the active height of the channel region, as such an issue can result in un-controlled sub-fin leakage that causes power consumption degradation and other undesired performance issues. The buried etch-stop layer is formed below the channel material, such as in the epitaxial stack that includes the channel material, and acts to slow the removal of material after the channel material has been removed when etching to form the source/drain trenches. In other words, the buried etch-stop layer includes different material from the channel material that can be etched, for at least one given etchant, at a relatively slower rate than the channel material to help control the source/drain trench depth.

20 Claims, 11 Drawing Sheets

(51) Int. Cl.
*H01L 29/423* (2006.01)
*H01L 29/786* (2006.01)
*H01L 29/78* (2006.01)
*H01L 21/74* (2006.01)
*H01L 29/66* (2006.01)
H01L 29/20 (2006.01)
H01L 29/161 (2006.01)
H01L 29/16 (2006.01)

(56) References Cited

U.S. PATENT DOCUMENTS

2014/0084342 A1* 3/2014 Cappellani ............ H01L 29/401
 257/192
2015/0145003 A1* 5/2015 Rodder ................ H01L 29/785
 257/192
2018/0248028 A1* 8/2018 Mohapatra .......... H01L 27/0924

* cited by examiner

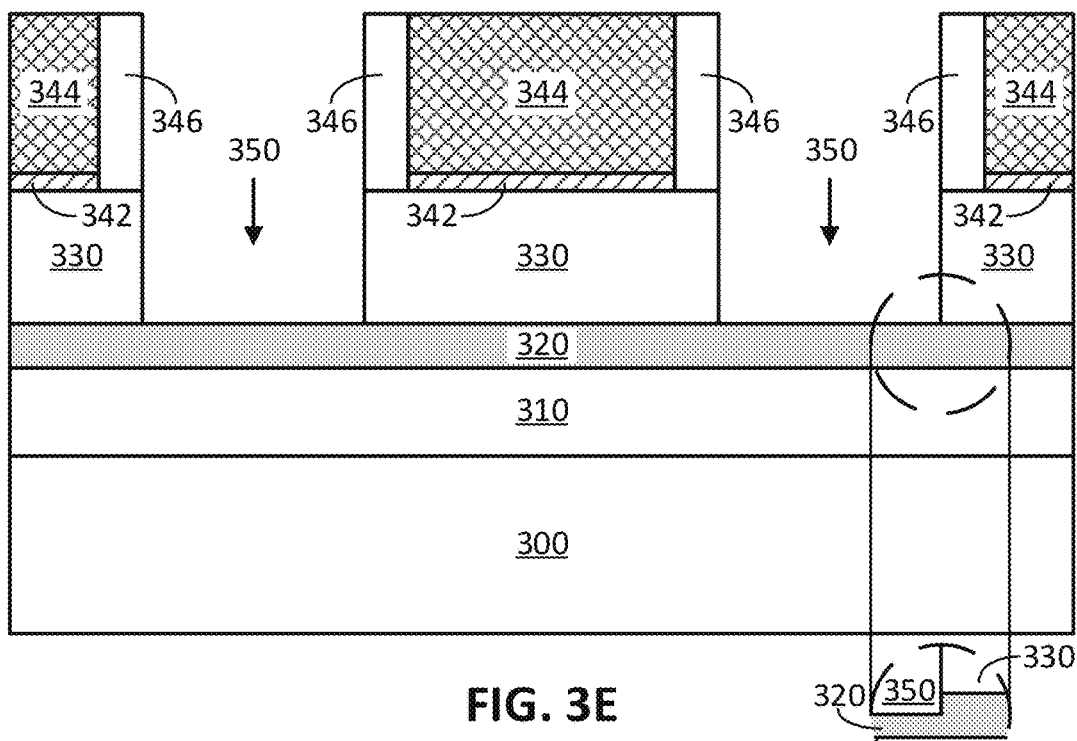
FIG. 3E
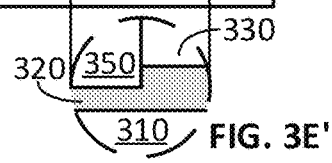
FIG. 3E'
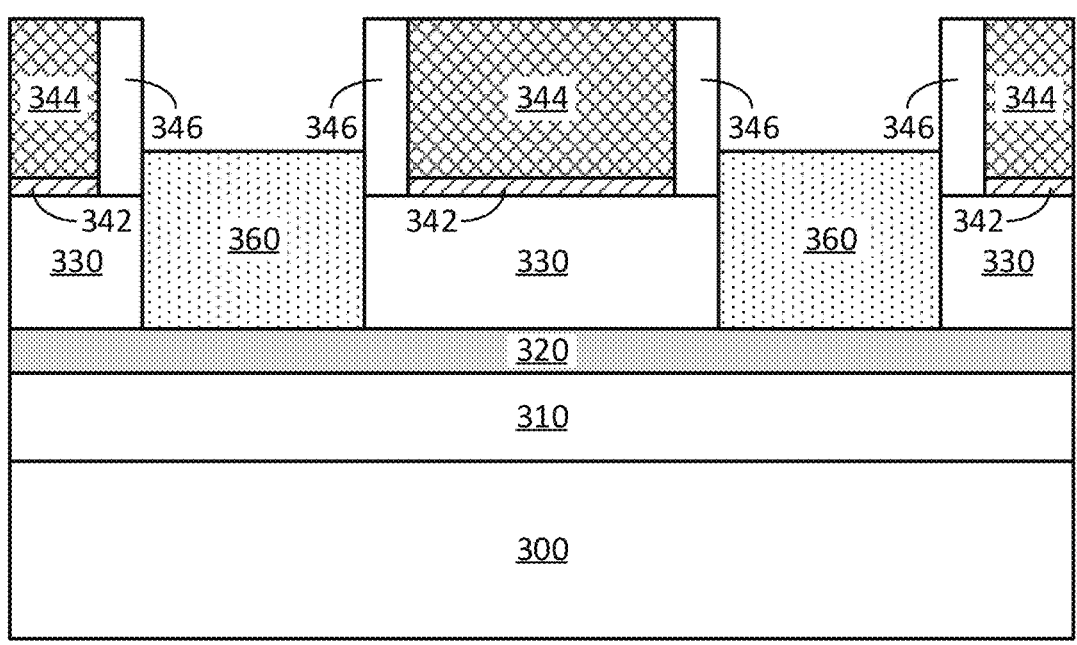
FIG. 3F
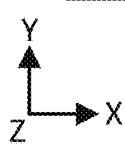

BURIED ETCH-STOP LAYER TO HELP CONTROL TRANSISTOR SOURCE/DRAIN DEPTH

BACKGROUND

Semiconductor devices are electronic components that exploit the electronic properties of semiconductor materials, such as silicon (Si), germanium (Ge), and gallium arsenide (GaAs). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel or n-type device, and in instances where the charge carriers are holes, the FET is referred to as a p-channel or p-type device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer regions of the fin (e.g., top and two sides), such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A gate-all-around (GAA) transistor, where the channel region includes, for example, one or more nanowires or nanoribbons, is configured similarly to a fin-based transistor, but instead of a finned channel region where the gate is on three portions (and thus, there are three effective gates), the gate material generally surrounds each nanowire or nanoribbon.

BRIEF DESCRIPTION OF THE DRAWINGS

FIGS. 3A-3H illustrate cross-sectional views of example integrated circuit structures formed when carrying out the method of FIG. 2 using a gate-first process flow, in accordance with some embodiments. FIGS. 3D', 3G', and 3H' illustrate variations to corresponding example structures of FIGS. 3D, 3G, and 3H that occur when carrying out the method of FIG. 2 using a gate-last process flow, in accordance with some embodiments. FIG. 3E' illustrates a variation to the corresponding example structure of FIG. 3E where a portion of the etch-stop layer was removed during the source/drain contact trench etch processing, in accordance with some embodiments. The cross-sectional views in FIGS. 3A-3H (as well as FIGS. 4, 4', 5, and 6) are along the body of channel material and perpendicular to the gate line to help illustrate the structures formed.

FIG. 4' illustrates the example integrated circuit structure of FIG. 3H' employing a buried etch-stop layer and a gate-last process flow, and having relative variations to the structure, in accordance with some embodiments.

Figure 1:
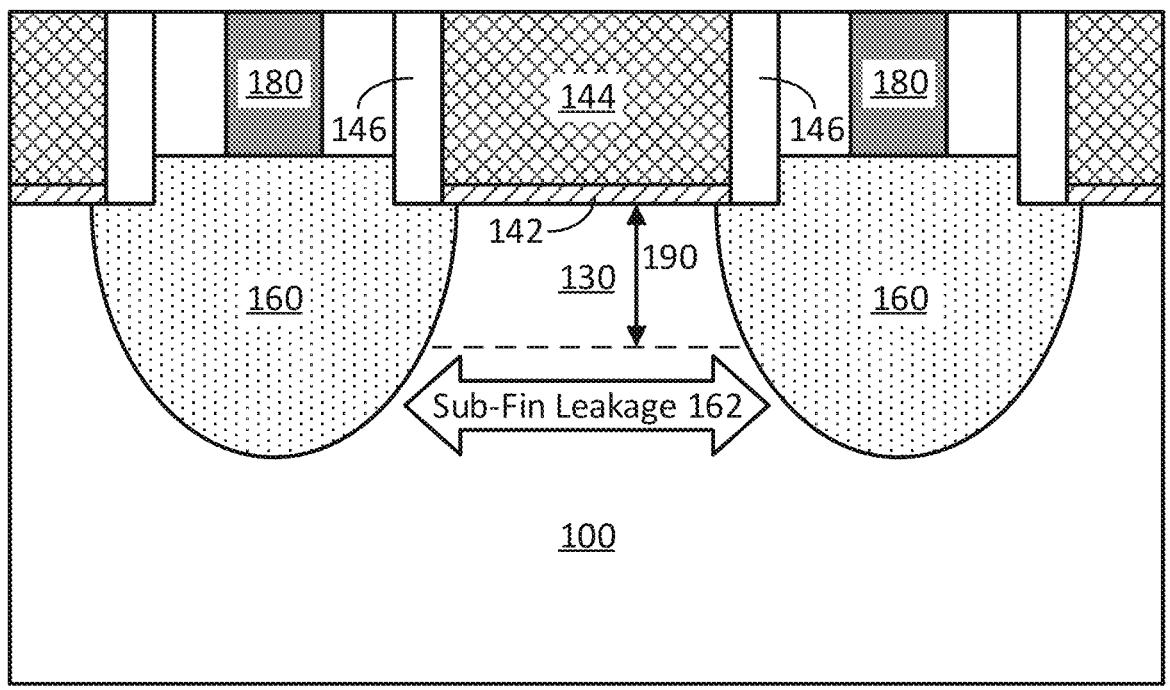
FIG. 1 illustrates a cross-sectional view of an example integrated circuit (IC) structure showing source/drain regions that extend below the active height of the channel region.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying distinct features. In short, the figures are provided merely to show example structures.

DETAILED DESCRIPTION

When forming transistor devices, such as MOSFETs, the source/drain region processing may include removing material in the source/drain regions and replacing it with final source/drain material, such as semiconductor material that includes desired dopant. The process for removing the initial material at the source/drain locations includes etch processing (which may be referred to as epi-undercut (EUC) etch processing) to form source/drain trenches. During such replacement source/drain etching, the gate structure is already formed over the channel region, thereby establishing the adjacent regions as the source/drain regions. The active height of the channel region is also defined by the gate structure, as it is the height adjacent to and/or between portions of the gate structure. The semiconductor material directly below the active height of the channel region is referred to as the sub-fin. The sub-fin is typically between two isolation regions of insulator material, such as two shallow trench isolation (STI) regions, as the sub-fin is not adjacent to the gate structure. An issue that occurs with the etch processing used to form the source/drain trenches is that such etch processing goes below the bottom of the active height of the channel region. This issue can result in uncontrolled sub-fin leakage, which is undesired leakage between the source and drain regions through the sub-fin (e.g., when the transistor is in an off-state). Sub-fin leakage results in undesirable power consumption degradation, thereby decreasing device performance. Further, undesired sub-fin leakage is exacerbated as transistor devices are scaled down to have smaller and smaller critical dimensions.

For instance, FIG. 1 illustrates a cross-sectional view of an example integrated circuit (IC) structure showing source/drain regions that extend below the active height of the channel region. In more detail, the IC structure includes substrate 100 (such as a silicon substrate), fin portion 130 having active height 190 indicated by the dashed line (e.g., the height of the fin that is between two portions of the gate structure, which may be referred to as HSI, or the height of active silicon), gate dielectric 142, gate electrode 144, gate sidewall spacers 146, source/drain regions 160, and source/drain contacts 180. As shown source/drain regions 160 extend down past the active height 190 of the fin portion 130, which may be due to the source/drain trench etch extending down to such a depth and/or due to dopant diffusion from the source/drain regions 160 to underlying material. Regardless, because the source/drain regions 160 extend down past the active height 190 of the fin, sub-fin leakage 162 is an issue when, for example, the source is receiving current and some of that current passes from the source region to the drain region through the sub-fin (portion under the active height 190 of the fin). One approach to reduce or eliminate sub-fin leakage is to employ semiconductor on insulator (XOI) substrates or wafers, such as silicon on insulator (SOI) substrates in place of bulk silicon substrates. However, XOI substrates are more expensive than bulk silicon substrates. Further, XOI substrates may not be suitable for high power applications, because they tend to heat up more than bulk silicon substrates.

Thus, and in accordance with various embodiments of the present disclosure, a buried etch-stop layer to help control transistor source/drain depth is provided herein. In some embodiments, the buried etch-stop layer is a relatively thin layer formed in the epitaxial stack of channel material. In some embodiments, the buried etch-stop layer is formed below the layer of channel material and includes material that is compositionally different from that of the channel material. This allows the channel material to be etched away in the source/drain regions while the buried etch-stop layer provides a controlled stopping point for that source/drain etch. For instance, in a specific example, an etch-stop layer of silicon (Si) is employed below a channel layer of silicon germanium (SiGe) or germanium (Ge), such that the Si etch-stop layer is buried below the channel layer (between the channel layer and the substrate). As Si has etch selectivity relative to SiGe (for at least most Ge concentrations) and Ge for many different etchants, when portions of the SiGe or Ge channel layer are removed in the source/drain regions, the Si layer acts as an etch stop. This can help enable source/drain depths to be well controlled and designed to be placed at locations that limit or eliminate undesired sub-fin leakage.

Note that although the etch-stop layer is referred to as such herein, it is not intended to provide a complete physical stop of an etching process (although, it may in some instances). Instead, it is a term of art and generally indicates a layer including material that features different etch characteristics than material to be etched, where the different etch characteristics typically include a relatively slower etch rate for one or more etchants. In some such cases, the relatively slower etch rate may be at least 2, 3, 4, 5, 10, 20, 50, or 100 times slower, for example. In some embodiments, the etch-stop layer has a thickness in the range of 1-20 nm (or 1-10 nm), for example. In some embodiments, the etch-stop layer is targeted to be formed at or near (e.g., within 1-10 nm or 1-5 nm) the bottom of active height of the channel region of the transistor device.

In some embodiments, the channel layer and the etch-stop layer include compositionally different semiconductor material. Semiconductor materials that are compositionally different, as used herein, refers to two materials that have different chemical compositions and/or different crystallographic orientations. This compositional difference may be, for instance, by virtue of an element that is in one semiconductor material but not the other (e.g., SiGe is compositionally different from Si), or by way of one semiconductor material having all the same elements as a second semiconductor material, but at least one of those elements is intentionally provided at a different concentration in one material relative to the other material (e.g., SiGe having 70 atomic percent Ge is compositionally different from SiGe having 25 atomic percent Ge). In addition to such chemical composition diversity, two compositionally different semiconductor materials may also have distinct dopants (e.g., one includes n-type, while the other includes p-type) the same dopant type but at differing concentrations (e.g., one includes dopant at a concentration of less than 1E19 atoms per cubic cm, while the other includes dopant at a concentration of greater than 1E20 atoms per cubic cm). Further, even where two semiconductor materials are the same with the same dopant type and amount, they may include different crystallographic orientations that make them compositionally different (e.g., (110) Si would be different from (100) Si). As can be understood based on this disclosure, the compositionally different semiconductor material included in the channel layer and the etch-stop layer can enable the channel layer material to be etched at a relatively faster rate than the material included in the etch-stop layer, for a given etchant.

In some embodiments, the channel layer and etch-stop layer include group IV and/or group III-V semiconductor material. Note that the use of "group IV semiconductor material" (or "group IV" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Also note that group III may also be known as the boron group or IUPAC group 13, group IV may also be known as the carbon group or IUPAC group 14, and group V may also be known as the nitrogen group or IUPAC group 15, for example.

In some embodiments, both the channel layer and etch-stop layer include group IV semiconductor material. In some such embodiments, the channel and etch-stop layers include compositionally different semiconductor material. For instance, in some such embodiments, the layers may include different semiconductor materials (e.g., one includes Si and the other includes SiGe, or one includes SiGe and the other includes Ge, or one includes Si and the other includes Ge) or they both may include the same semiconductor material but in a compositionally different manner. In embodiments where the channel and etch-stop layers include the same group IV semiconductor material but in a compositionally different manner, they both may include, for example, SiGe where the Ge (or Si) concentration included in the layers differs. For instance, in some such embodiments, the Ge (or Si) concentration difference between the channel layer and etch-stop layer is set to ensure etch selectivity between the layers. Further, in some such embodiments, the Ge (or Si) concentration difference between the channel and etch-stop layers is at least 15, 20, 25, 30, 35, 40, 45, 50, 55, 60, 65, 70, 75, 80, 85, 90, or 95 atomic percent, for example. To provide a specific example for illustrative purposes, one of the two layers may include SiGe with a Ge concentration of 30 atomic percent, while the other of the two layers includes SiGe with a Ge concentration of 70 atomic percent, which is a difference of 40 atomic percent Ge. In such an example, the two layers still include compositionally different semiconductor material and can still be selectively etched relative to each other (e.g., using different ratios of HF/hydrogen peroxide/acetic acid ($HF:H_2O_2:CH_3COOH$) etchant).

In some embodiments, both the channel layer and etch-stop layer include group III-V semiconductor material. In some such embodiments, the channel and etch-stop layers include compositionally different semiconductor material. For instance, in some such embodiments, the layers may include different semiconductor materials (e.g., one includes InP and the other includes GaAs, or one includes InP and the other includes InGaAs, or one includes GaAs and the other includes InGaAs) or they both may include the same semiconductor material but in a compositionally different manner. In embodiments where the channel and etch-stop layers include the same group III-V semiconductor material but in a compositionally different manner, they both may include, for example, InGaAs where the In (or Ga) concentration included in the layers differs. For instance, in some such embodiments, the In (or Ga) concentration difference between the channel layer and etch-stop layer is set to ensure etch selectivity between the layers. Further, in some such embodiments, the In (or Ga) concentration difference between the channel and etch-stop layers is at least 10, 15, 20, 25, 30, 35, 40, or 45 atomic percent, for example (assuming that the As portion of the III-V compound comprises the other 50 atomic percent of the semiconductor material). To provide a specific example for illustrative purposes, one of the two layers may include InGaAs with an In concentration of 10 atomic percent ($In_{0.2}Ga_{0.8}As$), while the other of the two layers includes InGaAs with an In concentration of 26.5 atomic percent ($In_{0.53}Ga_{0.47}As$), which is a difference of 16.5 atomic percent In. In such an example, the two layers still include compositionally different semiconductor material and can still be selectively etched relative to each other (e.g., using different ratios of citric acid/hydrogen peroxide ($C_6H_8O_7:H_2O_2$) etchant).

Recall that in some embodiments, compositionally different may further refer to two semiconductor materials that have different crystallographic orientations. For instance, (110) Si is different from (100) Si. Creating a stack of different orientated semiconductor material can be accomplished via blanket wafer layer transfer, for example. Further, the different crystallographic orientations, at least in some cases, can provide etch selectivity between the two materials. For instance, in some embodiments, an anisotropic etch is used when performing the source/drain trench etch to remove the semiconductor material having one crystallographic orientation at a faster rate than the semiconductor material having the other crystallographic orientation. Further still, the crystalline quality of the semiconductor material may also be different to provide etch selectivity, such as polycrystalline or amorphous semiconductor material versus monocrystalline semiconductor material (e.g., poly-Si versus crystalline Si).

In some embodiments, one of the channel layer and the etch-stop layer includes group IV semiconductor material, while the other includes group III-V semiconductor material. In some embodiments, the channel layer and the etch-stop layer include the same semiconductor material (and at the same concentrations, if the semiconductor material is a compound), but they include relatively different doping levels. For instance, to provide a specific example for illustrative purposes, should the channel layer include a relatively high dopant concentration (e.g., greater than 1E19, 5E19, 1E20, 5E20, or 1E21 atoms per cubic cm), while the etch-stop layer includes a relatively low dopant concentration (e.g., less than 1E16 atoms per cubic cm), then there may be suitable etch selectivity between them such that the channel layer material can be removed using a given etchant, while the etch-stop layer has a relatively slower etch rate for the given etchant.

The techniques and structures disclosed herein provide many benefits. For instance, the buried etch-stop layer helps enable the use of non-silicon channel materials while also minimizing or reducing sub-fin leakage. Further, the buried etch-stop layer helps with the uniformity of all source/drain regions formed on the integrated circuit structure, and particularly helps with controlling the depth of those source/drain regions (e.g., to limit or eliminate sub-fin leakage). In addition, the techniques and structures disclosed herein can help with scaling transistor devices to increase the number of devices that can be fit in a given area. Numerous other benefits will be apparent in light of this disclosure.

Note that, as used herein, the expression "X includes at least one of A or B" refers to an X that includes, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that includes just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that is included, for example, in just A only, in just B only, or in both A and B. The above discussion with respect to "X includes at least one of A or B" equally applies here, as will be appreciated. Moreover, this is true for any number of items.

Use of the techniques and structures provided herein can be detected using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools can indicate an integrated circuit including at least one transistor employing a buried etch-stop layer as variously described herein. For instance, the buried hetero-interface in non-silicon channel material can be detected in an EDX scan, where such buried hetero-interface may include a SiGe/Si/SiGe stack, to provide a specific example. Further, such a stack may be formed on a bulk silicon substrate, in some embodiments. In some embodiments, the techniques and structures can be detected based on the buried etch-stop layer extending from between the source region and the substrate, to between the body of channel material and the substrate, to between the drain region and the substrate, such that it is one continuous layer that was purposefully employed. In some embodiments, the techniques described herein can be detected based on the structures formed therefrom. In addition, in some embodiments, the techniques and structures described herein can be detected based on the benefits derived therefrom. Numerous configurations and variations will be apparent in light of this disclosure.

Architecture and Methodology

Figure 2:
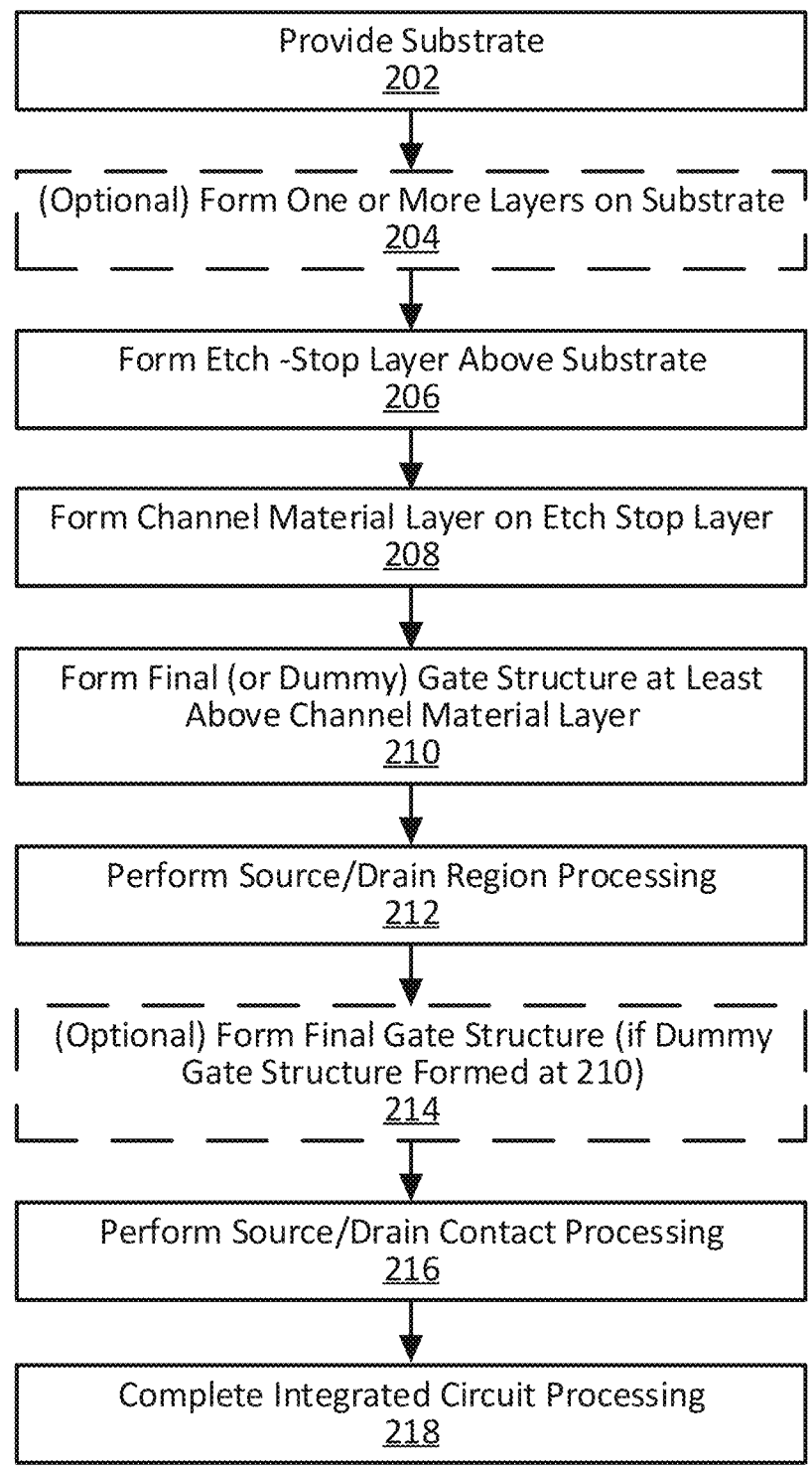
FIG. 2 illustrates method 200 of forming an integrated circuit including a buried etch-stop layer to help control transistor source/drain depth, in accordance with some embodiments.
Figure 3A:
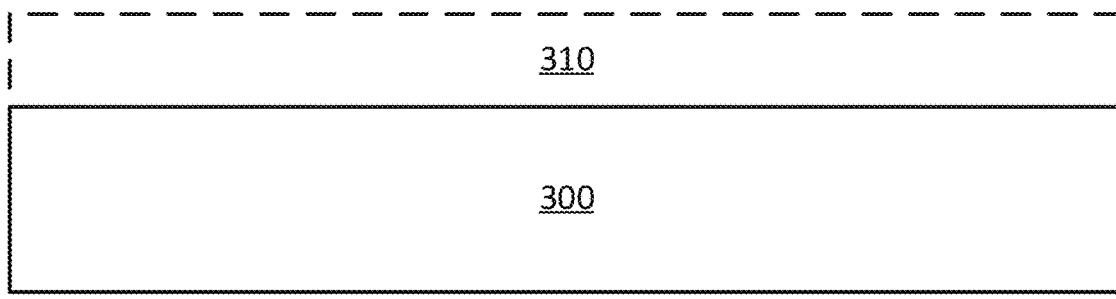

FIG. 2 illustrates method 200 of forming an integrated circuit (IC) including a buried etch-stop layer to help control transistor source/drain depth, in accordance with some embodiments. FIGS. 3A-3H illustrate cross-sectional views of example IC structures formed when carrying out method 200 of FIG. 2 using a gate-first process flow, such that the final gate structure is formed at 210 and optional process 214 is not performed, in accordance with some embodiments. FIGS. 3D', 3G', and 3H' illustrate variations to corresponding example structures of FIGS. 3D, 3G, and 3H, that occur when carrying out method 200 of FIG. 2 using a gate-last process flow, such that a dummy gate structure 344' is formed at 210 and optional process 214 is performed, in accordance with some embodiments. FIG. 3E' illustrates a variation to the corresponding example structure of FIG. 3E where a portion of the etch-stop layer 320 was removed during the source/drain contact trench etch processing, in accordance with some embodiments. The cross-sectional views in FIGS. 3A-3E (as well as FIGS. 4, 4', 5, and 6) are along the body of channel material and perpendicular to the gate lines to assist with illustrating the buried etch-stop layer and its impact on helping to control the transistor source/drain depth.

A multitude of different transistor devices can benefit from the techniques described herein, which includes, but is not limited to, various field-effect transistors (FETs), such as metal-oxide-semiconductor FETs (MOSFETs), tunnel FETs (TFETs), and Fermi filter FETs (FFFETs) (also known as tunnel source MOSFETs), to name a few examples. For example, the techniques can be used to benefit an n-channel MOSFET (NMOS) device, which may include a source-channel-drain scheme of n-p-n or n-i-n, where 'n' indicates n-type doped semiconductor material, 'p' indicates p-type doped semiconductor material, and T indicates intrinsic/undoped semiconductor material (which may also include nominally undoped semiconductor material, including dopant concentrations of less than 1E16 atoms per cubic centimeter (cm), for example), in accordance with some embodiments. In another example, the techniques can be used to benefit a p-channel MOSFET (PMOS) device, which may include a source-channel-drain scheme of p-n-p or p-i-p, in accordance with some embodiments. In yet another example, the techniques can be used to benefit a TFET device, which may include a source-channel-drain scheme of p-i-n or n-i-p, in accordance with some embodiments. In other words, a TFET device may appear the same as a MOSFET device, except that the source and drain regions include opposite type dopant. In still another example, the techniques can be used to benefit a FFFET device, which may include a source-channel-drain scheme of np-i-p (or np-n-p) or pn-i-n (or pn-p-n), in accordance with some embodiments. In other words, such FFFET devices include a bilayer source region configuration where one of the sub-layers of the bilayer includes n-type dopant and the other includes p-type dopant.

Figure 7A:
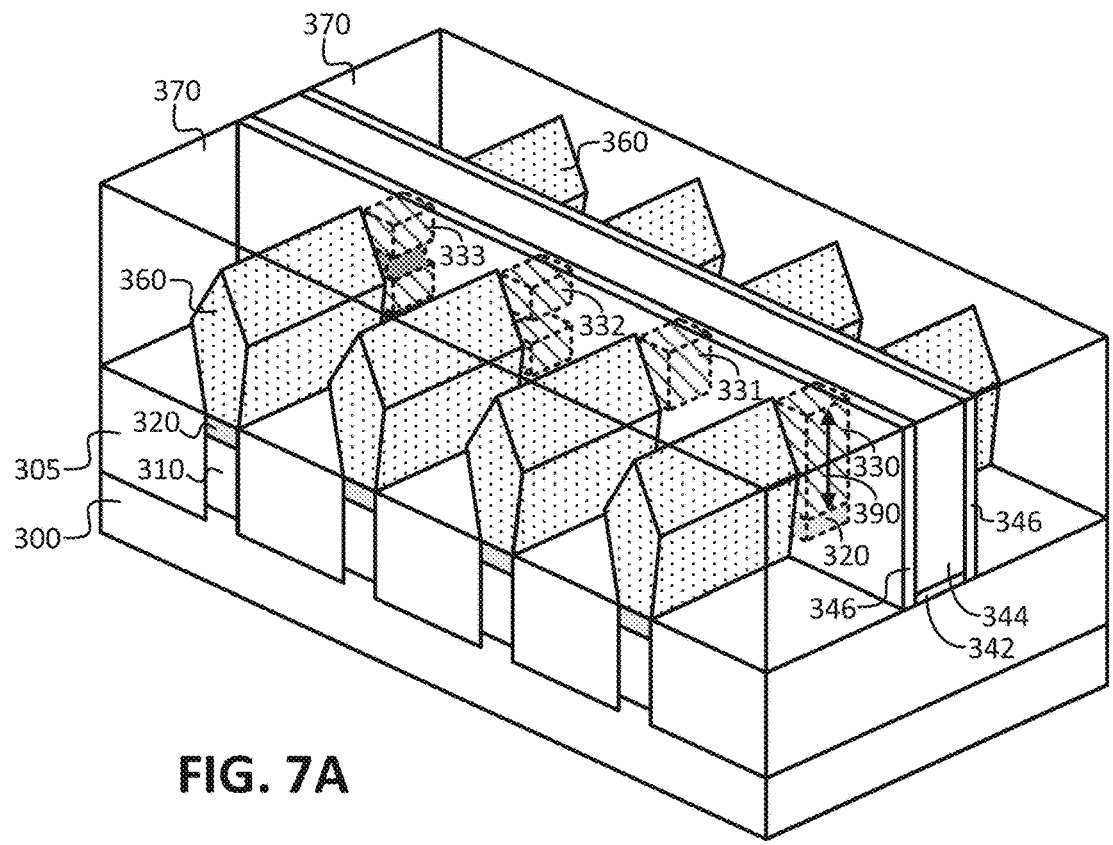
FIGS. 7A-B illustrate perspective views of an example integrated circuit structure including a buried etch-stop layer and illustrating multiple non-planar configurations, in accordance with some embodiments.
Figure 7B:
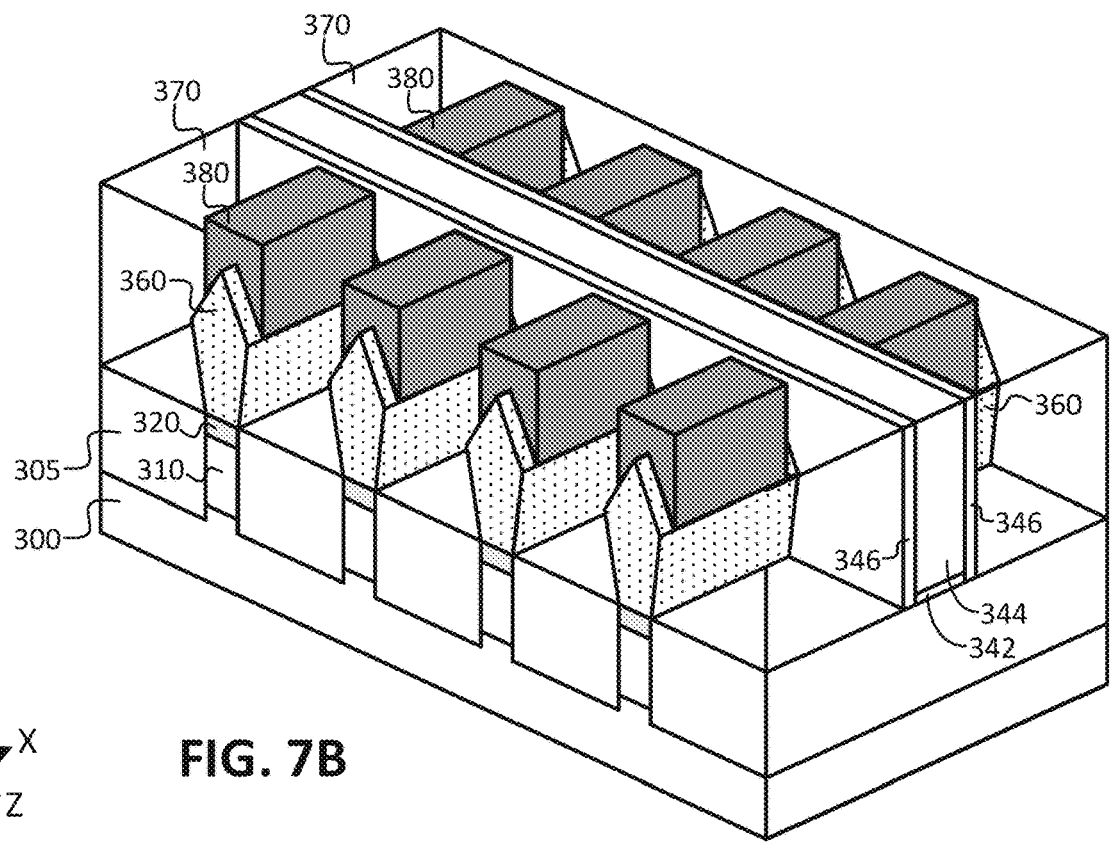

In addition, in some embodiments, the techniques can be used to benefit transistors including a multitude of configurations, such as planar and/or non-planar configurations, where the non-planar configurations may include finned or FinFET configurations (e.g., dual-gate or tri-gate), gate-all-around (GAA) configurations (e.g., nanowire or nanoribbon), or some combination thereof (e.g., a beaded-fin configuration), to provide a few examples. For instance, FIGS. 7A-B illustrate example IC structure including transistors having non-planar configurations, as will be described in more detail below. Further, the techniques are used in some embodiments to benefit complementary transistor circuits, such as complementary MOS (CMOS) circuits, where the techniques may be used to benefit one or more of the included n-channel and/or p-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Note that deposition or epitaxial growth techniques (or more generally, additive processing) where described herein can use any suitable techniques, such as chemical vapor deposition (CVD), physical vapor deposition (PVD), atomic layer deposition (ALD), and/or molecular beam epitaxy (MBE), to provide some examples. Also note that etching techniques (or more generally, subtractive processing) where described herein can use any suitable techniques, such as wet and/or dry etch processing which may be isotropic (e.g., uniform etch rate in all directions) or anisotropic (e.g., etch rates that are orientation dependent), and which may be non-selective (e.g., etches all exposed materials at the same or similar rates) or selective (e.g., etches different materials that are exposed at different rates). Further note that other processing may be used to form the and integrated circuit structures described herein as will be apparent in light of this disclosure, such as hardmasking, patterning or lithography (via suitable lithography techniques, such as, e.g., photolithography, extreme ultraviolet lithography, x-ray lithography, or electron beam lithography), planarizing or polishing (e.g., via chemical-mechanical planarization (CMP) processing), doping (e.g., via ion implantation, diffusion, or including dopant in the base material during formation), and annealing, to name some examples.

In embodiments where semiconductor material described herein includes dopant, the dopant is any suitable n-type and/or p-type dopant that is known to be used for the specific semiconductor material. For instance, in the case of group IV semiconductor materials (e.g., Si, SiGe, Ge), p-type dopant includes group III atoms (e.g., boron, gallium, aluminum), and n-type dopant includes group V atoms (e.g., phosphorous, arsenic, antimony). In the case of group III-V semiconductor materials (e.g., GaAs, InGaAs, InP, GaP), p-type dopant includes group II atoms (e.g., beryllium, zinc, cadmium), and n-type dopant includes group VI atoms (e.g., selenium, tellurium). However, for group III-V semiconductor materials, group VI atoms (e.g., silicon, germanium) can be employed for either p-type or n-type dopant, depending on the conditions (e.g., formation temperatures). In embodiments where dopant is included in semiconductor material, the dopant can be included at quantities in the range of 1E16 to 1E22 atoms per cubic cm, or higher, for example. In some embodiments, dopant is included in semiconductor material in a quantity of at least 1E16, 1E17, 1E18, 5E18, 1E19, 5E19, 1E20, 5E20, or 1E21 atoms per cubic cm and/or of at most 1E22, 5E21, 1E21, 5E20, 1E20, 5E19, 1E19, 5E18, or 1E18 atoms per cubic cm, for example. In some embodiments, semiconductor material described herein is undoped/intrinsic, or includes relatively minimal dopant, such as a dopant concentration of less than 1E16 atoms per cubic cm, for example. Note that semiconductor material described herein has a monocrystalline or single-crystal structure (also referred to as a crystalline structure) unless otherwise explicitly stated (e.g., unless referred to as having a polycrystalline or amorphous structure).

Method 200 of FIG. 2 includes providing 202 a substrate, such as substrate 300 of the example structure of FIG. 3A, in accordance with some embodiments. In some embodiments, substrate 300 is: a bulk substrate including group IV semiconductor material (such as Si, Ge, and/or SiGe), group III-V semiconductor material, and/or any other suitable material(s) as will be apparent in light of this disclosure; an X on insulator (XOI) structure where X is one of the aforementioned materials (e.g., group IV and/or group III-V semiconductor material) and the insulator material is an oxide material or dielectric material or some other electrically insulating material, such that the XOI structure includes the electrically insulating material layer between two semiconductor layers; or some other suitable multilayer structure where the top layer includes one of the aforementioned semiconductor materials (e.g., group IV and/or group III-V semiconductor material). In embodiments where the substrate 300 (or at least the top layer of the substrate, where substrate 300 is a multilayer structure) includes semiconductor material, the semiconductor material may include dopant or the semiconductor material may be undoped/intrinsic. In some embodiments, the substrate can be an insulator or dielectric substrate, such as a glass substrate. For ease of discussion, in some embodiments, it is assumed that the structures described herein are formed above (and in some cases, directly on) a bulk Si substrate. Thus, in such embodiments, substrate 300 is a bulk Si substrate (that either does or does not include dopant), which may be desirable due to the relatively low cost and availability of such bulk Si substrates.

In some embodiments, substrate 300 includes a surface crystalline orientation described by a Miller index of (100), (110), or (111), or its equivalents. Although substrate 300 is shown in the figures as having a thickness (dimension in the Y-axis direction) similar to other layers for ease of illustration, in some instances, substrate 300 is relatively much thicker than the other layers, such as having a thickness in the range of 1 to 950 microns (or in the sub-range of 20 to 800 microns), for example, or any other suitable thickness value or range as will be apparent in light of this disclosure. In some embodiments, substrate 300 includes a multilayer structure including two or more distinct layers (that may or may not be compositionally different). In some embodiments, substrate 300 includes grading (e.g., increasing and/or decreasing) of one or more material concentrations throughout at least a portion of the substrate 300. In some embodiments, substrate 300 is used for one or more other IC devices, such as various diodes (e.g., light-emitting diodes (LEDs) or laser diodes), various transistors (e.g., MOSFETs, TFETs), various capacitors (e.g., MOSCAPs), various microelectromechanical systems (MEMS), various nanoelectromechanical systems (NEMS), various radio frequency (RF) devices, various sensors, and/or any other suitable semiconductor or IC devices, depending on the end use or target application. Accordingly, in some embodiments, the structures described herein are included in system-on-chip (SoC) applications.

Method 200 of FIG. 2 optionally continues with forming 204 one or more layers on substrate 300, such as to form the example resulting structure of FIG. 3A including optional layer 310, in accordance with some embodiments. As shown in FIG. 3A, optional layer 310 is in dashed lines to indicate that it is an optional layer. For instance, in FIGS. 3B-H, layer 310 is included and shown as a single layer, while in FIG. 5, optional layer 310 is not present such that the etch-stop layer 320 is formed directly on substrate 300, in accordance with some embodiments. In some embodiments, the layers formed on substrate 300, such as optional layer 310, etch-stop layer 320, and/or channel material layer 330 are formed by blanket depositing (on at least a portion of substrate 300) the layer(s) and then patterning the layer(s) into a desired shape, such as a fin, for example. In other embodiments, the layers formed on substrate 300, such as optional layer 310, etch-stop layer 320 and/or channel material layer 330 are formed in an insulator material trench (e.g., a trench formed between two shallow trench isolation (STI) regions), which can be formed by forming the top of the substrate into fins, forming the insulator around the fins, and then recessing or removing the fins via etching to form the trenches, for example. In some such embodiments, the insulator material is recessed to expose at least a portion of the channel material layer 330 (e.g., which may be shaped like fins for non-planar configurations), while in other embodiments, the insulator material is not recessed (e.g., for planar configurations, where devices are formed on only the top surface of the channel material layer 330).

Optional layer 310 may be employed, in some embodiments, to change the lattice constant of the top surface of the structure (relative to the lattice constant of the top surface of substrate 300), thereby providing a desired surface lattice constant on which subsequent layers can be formed. In some such embodiments, layer 310 is formed to have a substantial thickness to allow the layer to relax at least near the top of the layer (e.g., such that any defects reside in or terminate near the bottom of the layer). In some embodiments, optional layer 310 is a buffer layer between the substrate 300 and etch-stop layer 320. In some embodiments, optional layer 310 (where present) includes semiconductor material that either does or does not include dopant. In some such embodiments, the semiconductor material includes group IV and/or group III-V semiconductor material. Thus, in some embodiments, semiconductor material included in layer 310 includes one or more of silicon, germanium, tin, indium, gallium, aluminum, phosphorous, arsenic, nitrogen, antimony, or bismuth, for example. In some embodiments, where layer 310 is present, it includes a multilayer structure of two or more sub-layers including compositionally different material. In some embodiments, where layer 310 is present, it includes grading (e.g., increasing and/or decreasing) of one or more material concentrations throughout at least a portion of the layer 310. In some embodiments, where layer 310 is present, it has a thickness (dimension in the Y-axis direction) in the range of 10-500 nm (or in a sub-range of 10-20, 10-50, 10-100, 10-250, 20-50, 20-100, 20-250, 20-500, 50-100, 50-250, 50-500, 100-250, 100-500, or 250-500 nm), or greater, or within any other suitable range or having any other suitable value as will be apparent in light of this disclosure. In some embodiments, where layer 310 is present, it has a thickness of at least 10, 20, 50, 100, 200, 250, or 300 nm and/or at most 500, 400, 300, 250, 200, 100, or 50 nm, for example.

Figure 3B:
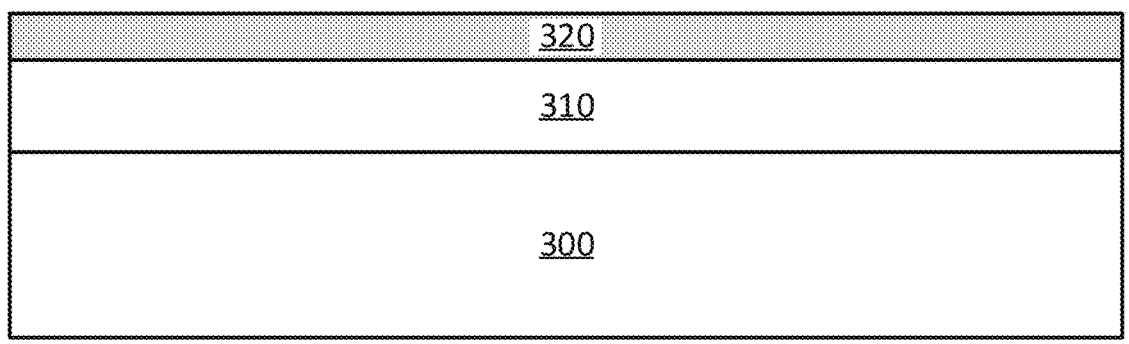
Figure 3B:
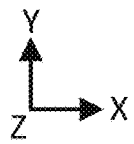

Method 200 of FIG. 2 continues with forming 206 an etch-stop layer 320 above the substrate 300, such as to form the example resulting structure of FIG. 3B, in accordance with some embodiments. Recall that optional layer 310 is present in the structure of FIG. 3B, such that etch-stop layer 320 is formed directly on that layer 310, in this embodiment. However, in other embodiments, etch-stop layer 320 is formed directly on substrate 300, such as is shown in the example structure of FIG. 5. Also recall that etch-stop layer 320 may be formed using either a blanket deposition and patterning of the layer or by forming the layer by depositing it in a fin-shaped trench (where the trench is between insulator material, such as two STI regions).

In some embodiments, etch-stop layer 320 includes semiconductor material. In some such embodiments, the semiconductor material included in etch-stop layer 320 may or may not include dopant (n-type and/or p-type dopant). In some embodiments, etch-stop layer 320 includes group IV and/or group III-V semiconductor material. Thus, in some embodiments, semiconductor material included in layer 320 includes one or more of silicon, germanium, tin, carbon, indium, gallium, aluminum, phosphorous, arsenic, nitrogen, antimony, or bismuth, for example. In some embodiments, the etch-stop layer 320 includes carbon (e.g., as a dopant in a concentration of up to 1, 2, 5, 10, 15, or 20 atomic percent) to increase the robustness of the etch-stop layer, thereby making it more difficult to etch and increasing its etch stop effectiveness. In some embodiments, etch-stop layer 320 includes a multilayer structure of two or more sub-layers including compositionally different material. In some embodiments, etch-stop layer 320 includes grading (e.g., increasing and/or decreasing) of one or more material concentrations throughout at least a portion of the layer 320. In some embodiments, etch-stop layer 320 is a thin sacrificial layer in an epitaxial stack of channel material that acts as an etch-stop marker to help enable source-drain depth to be well controlled, such that sub-fin leakage can be limited or eliminated. Therefore, in some such embodiments, the material of etch-stop layer 320 is selected based on the desired material of channel layer 330, as is described in more detail herein.

In some embodiments, etch-stop layer 320 has a thickness (dimension in the Y-axis direction) in the range of 1-20 nm (or in a sub-range of 1-3, 1-5, 1-10, 2-5, 2-10, 2-20, 3-8, 3-15, 3-20, 5-10, 5-20, or 10-20 nm), or greater, or within any other suitable range or having any other suitable value as will be apparent in light of this disclosure. In some embodiments, etch-stop layer 320 has a thickness of at least 1, 2, 3, 5, 8, 10, 12, or 15 nm and/or at most 50, 35, 20, 15, 12, 10, 8, or 5 nm, for example. In some embodiments, etch-stop layer 320 has a thickness less than the critical thickness for the layer (e.g., based on the material of the etch-stop layer 320, the material and structure of the surface etch-stop layer 320 is grown on, and/or the growth conditions). The critical thickness of a layer is the thickness beyond which dislocations are introduced and a thickness less than the critical thickness may be referred to as the pseudomorphic thickness. In embodiments where etch-stop layer 320 is below the critical thickness for the layer, it may have a thickness in the range of 1-10 nm or 1-5 nm, for example. However, in some embodiments, the etch-stop layer 320 has a greater thickness and is still below the critical thickness for the layer. In some embodiments, it is desired to grow a relatively thick etch-stop layer 320, such as having a thickness of at least 10, 15, 20, 25, or 50 nm to cause strain (tensile or compressive) in the overlying channel layer 330. Such strain may be desired to increase carrier mobility, for example. In some embodiments, it is desired to grow a relatively thick etch-stop layer 320, such as having a thickness of at least 10, 15, 20, 25, or 50 nm to ensure that it operates effectively as an etch stop during the source/drain trench etching.

Figure 3C:
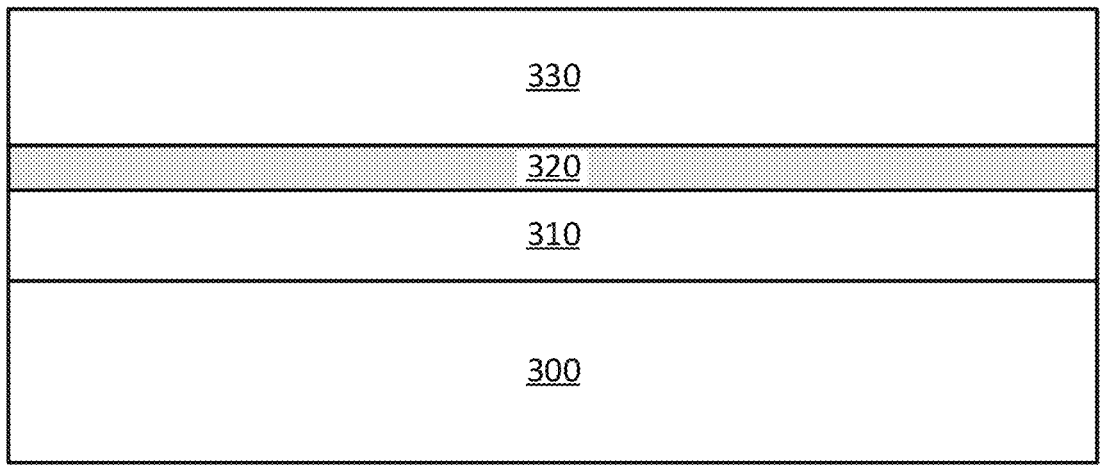
Figure 3D:
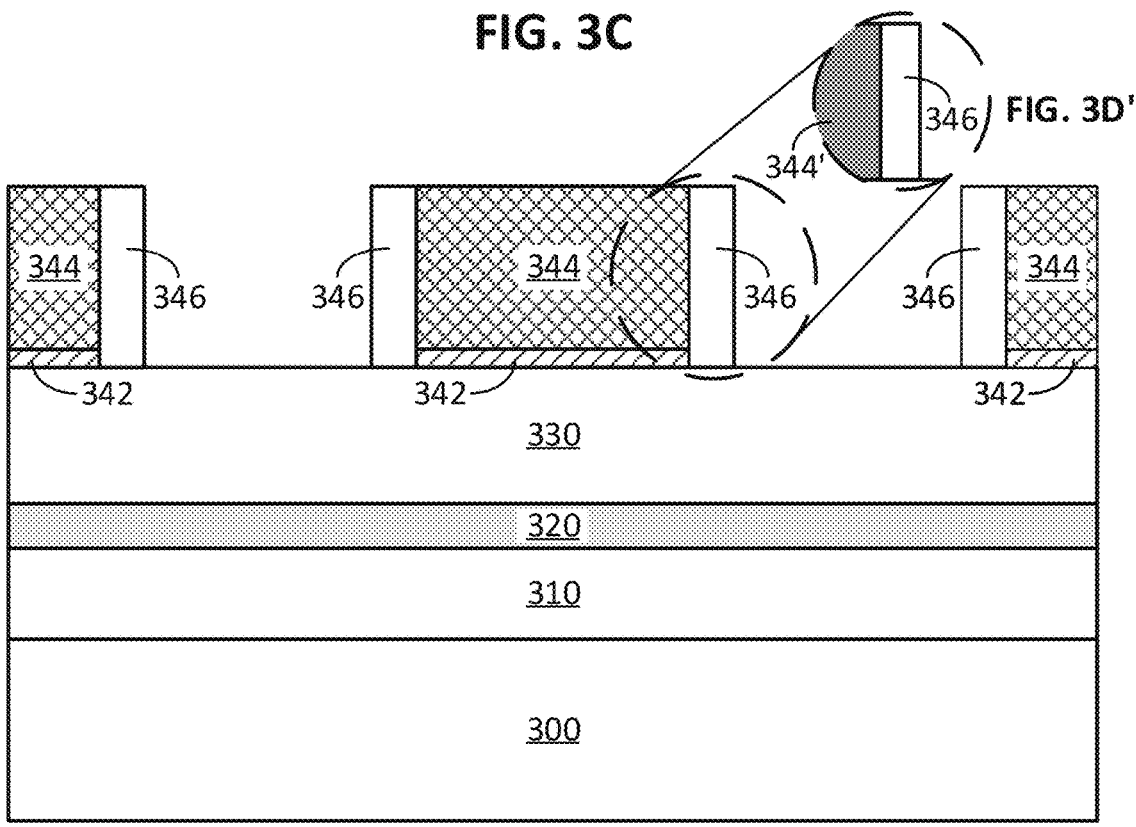

Method 200 of FIG. 2 continues with forming 208 channel material layer 330 on etch-stop layer 320, such as to form the example resulting structure of FIG. 3C, in accordance with some embodiments. Note that channel material layer 330 is also referred herein to as simply channel layer or a body (of channel material). Regardless, layer or body 330 is referred to as such because it includes a region in which the channel of carrier travel resides when the transistor device is in the on-state. Recall that channel layer 330 may be formed using either a blanket deposition and patterning of the layer or by forming the layer by depositing it in a fin-shaped trench (where the trench is between insulator material, such as two STI regions).

In some embodiments, channel layer 330 includes semiconductor material. In some such embodiments, the semiconductor material included in channel layer 330 may or may not include dopant (n-type and/or p-type dopant). In some embodiments, etch-stop layer 330 includes group IV and/or group III-V semiconductor material. Thus, in some embodiments, semiconductor material included in layer or body 330 includes one or more of silicon, germanium, tin, indium, gallium, aluminum, phosphorous, arsenic, nitrogen, antimony, or bismuth, for example. In some embodiments, channel layer 330 includes a multilayer structure of two or more sub-layers including compositionally different material. For instance, in gate-all-around (GAA) embodiments, channel layer 330 is a multilayer stack including one or more sacrificial layers and one or more final layers, where the sacrificial layers are to be later removed (e.g., during replacement gate processing) to release the final layers in the channel region, thereby allowing the gate structure to be formed around those one or more final layers (which may be referred to as nanowires or nanoribbons). In some embodiments, channel layer 330 includes grading (e.g., increasing and/or decreasing) of one or more material concentrations throughout at least a portion of the layer 330.

In some embodiments, channel layer 330 has a thickness (dimension in the Y-axis direction) in the range of 5-200 nm (or in a subrange of 5-25, 5-50, 5-100, 10-25, 10-50, 10-80, 10-100, 10-200, 20-80, 20-100, 20-200, 40-80, 40-120, 40-200, 50-100, 50-200, or 100-200 nm) or greater, or within any other suitable range or having any other suitable value as will be apparent in light of this disclosure. In some embodiments, channel layer 330 has a thickness of at least 5, 10, 15, 20, 25, 50, 80, 100, 120, or 150 nm, and/or at most 200, 150, 120, 100, 80, 50, or 25 nm, for example. In some embodiments, channel layer 330 is used for a planar configuration, where the channel only resides in/near the top surface of the channel layer 330, such as where the final gate structure described herein is formed only above the channel layer 330. In other embodiments, channel layer 330 is used for non-planar configurations, where the channel resides in/near multiple sides of the channel layer 330. For instance, in some non-planar embodiments, channel layer or body 330 is a fin or includes a fin-like shape, where the fin body is between portions of the final gate structure. Such configurations may be referred to as having a FinFET or tri-gate structure. In some non-planar embodiments, a gate-all-around configuration is employed where the final gate structure is around the channel layer or body 330, such that the body 330 is a nanowire or nanoribbon, for example. Non-planar configurations are described in more detail herein. Note that the figures and accompanying description provided herein generally apply to both planar and non-planar configurations, unless explicitly stated otherwise.

In some embodiments, channel layer 330 includes germanium. In some such embodiments where channel layer 330 includes germanium, the germanium concentration may be in the range of 30 to 100 atomic percent, for example. Further, in some such embodiments where channel layer 330 includes germanium, the body may also include silicon and/or tin. In another example embodiment, channel layer 330 includes indium, such as in a group III-V semiconductor compound of InAs, InGaAs, InAlAs, InP, or InGaN, to provide some example compounds. In another example embodiment, channel layer 330 includes gallium, such as in a group III-V semiconductor compound of GaAs, InGaAs, GaN, AlGaN, InGaN, GaP, or GaSb, to provide some example compounds. In another example embodiment, channel layer 330 includes arsenic, such as in a group III-V semiconductor compound of InAs, InGaAs, GaAs, AlAs, or InAlAs, to provide some example compounds. In some embodiments, optional layer 310 (where present) and channel layer 330 include the same semiconductor material. In some embodiments, optional layer 310 (where present) and channel layer 330 include compositionally different semiconductor material. In some embodiments, both etch-stop layer 320 and channel layer 330 include group IV semiconductor material. In some embodiments, both etch-stop layer 320 and channel layer include group III-V semiconductor material. In some embodiments, etch-stop layer 320 includes group IV semiconductor material and channel layer 330 includes group III-V semiconductor material. In some embodiments, etch-stop layer 320 includes group III-V semiconductor material and channel layer includes group IV semiconductor material.

Table 1 below illustrates numerous (but non-exhaustive) examples of combinations of semiconductor material included in optional layer 310 (where present), etch-stop layer 320, and channel layer/body 330. Recall that where optional layer 310 is not present, in some embodiments, etch-stop layer 320 is formed directly on substrate 300, and in some such embodiments, substrate 300 is a bulk Si substrate.

TABLE 1

Examples of combinations of semiconductor material included in optional layer 310 (where present), etch-stop layer 320, and channel layer/body 330.

| Optional Layer 310 (if present) | Etch-Stop Layer 320 | Channel Layer/ Body 330 |
|---|---|---|
| Present (e.g., SiGe or Ge) | Si | SiGe or Ge |
| Not present | Si | SiGe or Ge |
| Present (e.g., SiGe or Ge) | SiGe ($1^{st}$ Ge concentration) | SiGe ($2^{nd}$ Ge concentration) |
| Not present | SiGe ($1^{st}$ Ge concentration) | SiGe ($2^{nd}$ Ge concentration) |
| Present (e.g., SiGe or Ge) | SiGe or Ge | GaAs, InGaAs, or InP |
| Not present | SiGe or Ge | GaAs, InGaAs, or InP |
| Present (e.g., SiGe or Ge) | InGaAs or InP | GaAs |
| Not present | InGaAs or InP | GaAs |
| Present (e.g., SiGe or Ge) | GaAs or InP | InGaAs |
| Not present | GaAs or InP | InGaAs |
| Present (e.g., SiGe or Ge) | GaAs or InGaAs | InP |
| Not present | GaAs or InGaAs | InP |
| Present (e.g., SiGe or Ge) | InGaAs ($1^{st}$ In concentration) | InGaAs ($2^{nd}$ In concentration) |
| Not present | InGaAs ($1^{st}$ In concentration) | InGaAs ($2^{nd}$ In concentration) |

Method 200 of FIG. 2 continues with forming 210 the final (or dummy) gate structure(s) on channel layer 330, such as to form the example resulting structure of FIG. 3D, in accordance with some embodiments. Note that there is one complete gate structure shown in the middle, while partial gate structures are shown on the left and right sides. However, the relevant description of the gate structure provided herein is equally applicable to all three structures, and so, their features are identified with the same numbers. The gate structure or gate stack in the example structure of FIG. 3D is shown as a final gate structure that will be in the final integrated circuit structure, and include gate dielectric 342 and gate electrode 344. In such embodiments, the processing includes a gate-first flow (also called up-front hi-k gate processing), where the final gate structure is formed prior to performing the source and drain region processing. Alternatively, in some embodiments, dummy gate structures are initially formed at 210 in a gate-last flow (also called a replacement gate or replacement metal gate (RMG) process). For instance, FIG. 3D' is a blown-out portion of FIG. 3D illustrating the alternative gate-last processing, which includes forming dummy gate structures at 210 instead of final gate structures, in accordance with some embodiments. As shown in FIG. 3D', dummy gate structure 344' was formed instead of the final gate structure, in accordance with some embodiments. The dummy gate structure 344', where employed, may include a dummy gate dielectric (e.g., dummy oxide material) and a dummy gate electrode (e.g., dummy poly-silicon material) to be used for the replacement gate process, where those dummy materials are intended to be sacrificial such that they can be later removed and replaced by the final gate structure.

Regardless of whether the final gate structure is formed using a gate-first or a gate-last process flow, it includes gate dielectric 342 and gate electrode 344. In some embodiments, the gate structure, whether final or dummy, may be formed by blanket depositing the final or dummy gate materials and then patterning the materials to the desired gate structure. However, any suitable techniques can be used to form the final and/or dummy gate structures, in accordance with some embodiments. In some embodiments, gate dielectric 342 includes an oxide (e.g., silicon dioxide), nitride (e.g., silicon nitride), high-k dielectric, low-k dielectric, and/or any other suitable material as will be apparent in light of this disclosure. Examples of high-k dielectrics include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. Examples of low-k dielectrics include, for instance, fluorine-doped silicon dioxide, carbon-doped silicon dioxide, porous silicon dioxide, porous carbon-doped silicon dioxide, spin-on organic polymeric dielectrics (e.g., polytetrafluoroethylene, benzocyclobutene, polynorbornenes, polyimide), spin-on silicon based polymeric dielectrics (e.g., hydrogen silsesquioxane, methylsilsesquioxane), to provide some examples. In some embodiments, an annealing process is carried out on the gate dielectric 342 to improve its quality when, for example, high-k dielectric material is employed.

In some embodiments, the gate dielectric 342 includes oxygen. In some such embodiments where the gate dielectric 342 includes oxygen, the gate dielectric 342 also includes one or more other materials, such as one or more of hafnium, silicon, lanthanum, aluminum, zirconium, tantalum, titanium, barium, strontium, yttrium, lead, scandium, tantalum, zinc, lithium, or niobium. For instance, the gate dielectric 342 may include hafnium and oxygen (e.g., in the form of hafnium oxide or hafnium silicon oxide), or the gate dielectric 342 may include silicon and oxygen (e.g., in the form of silicon dioxide, hafnium silicon oxide, or zirconium silicon oxide), in accordance with some embodiments. In some embodiments, the gate dielectric 342 includes nitrogen. In some such embodiments where the gate dielectric 342 includes nitrogen, the gate dielectric 342 may also include one or more other materials, such as silicon (e.g., silicon nitride) for instance. In some embodiments, the gate dielectric 342 includes silicon and oxygen, such as in the form of one or more silicates (e.g., titanium silicate, tungsten silicate, niobium silicate, and silicates of other transition metals). In some embodiments, the gate dielectric 342 includes oxygen and nitrogen (e.g., silicon oxynitride or aluminum oxynitride).

In some embodiments, the gate dielectric 342 includes a multilayer structure, including two or more compositionally distinct layers. For example, a multilayer gate dielectric can be employed to obtain desired electrical isolation and/or to help transition from the channel layer 330 to gate electrode 344, in accordance with some embodiments. In an example embodiment, a multilayer gate dielectric has a first layer nearest the channel layer 330 that includes oxygen and one or more materials included in the channel layer 330 (such as silicon and/or germanium), which may be in the form of an oxide (e.g., silicon dioxide or germanium oxide), and the multilayer gate dielectric also has a second layer farthest from the channel layer 330 (and nearest the gate electrode 344) that includes at least one high-k dielectric (e.g., hafnium and oxygen, which may be in the form of hafnium oxide or hafnium silicon oxide). In some embodiments where a multilayer gate dielectric is employed, the structure includes a first sub-layer that is only between the gate electrode 344 and the channel layer 330, and a second sub-layer that is both between the gate electrode 344 and the channel layer 330 as well as along sidewalls of the gate electrode 344 (e.g., between gate electrode and spacers 346). This may be achieved via replacement gate processing, where the final gate dielectric 342 is formed along sidewalls of dielectric material after the dummy gate structure (e.g., 344') is removed. In some embodiments, gate dielectric 342 includes grading (e.g., increasing and/or decreasing) the content/concentration of one or more materials through at least a portion of the gate dielectric, such as the oxygen content/concentration within the gate dielectric 342.

Figure 3G:
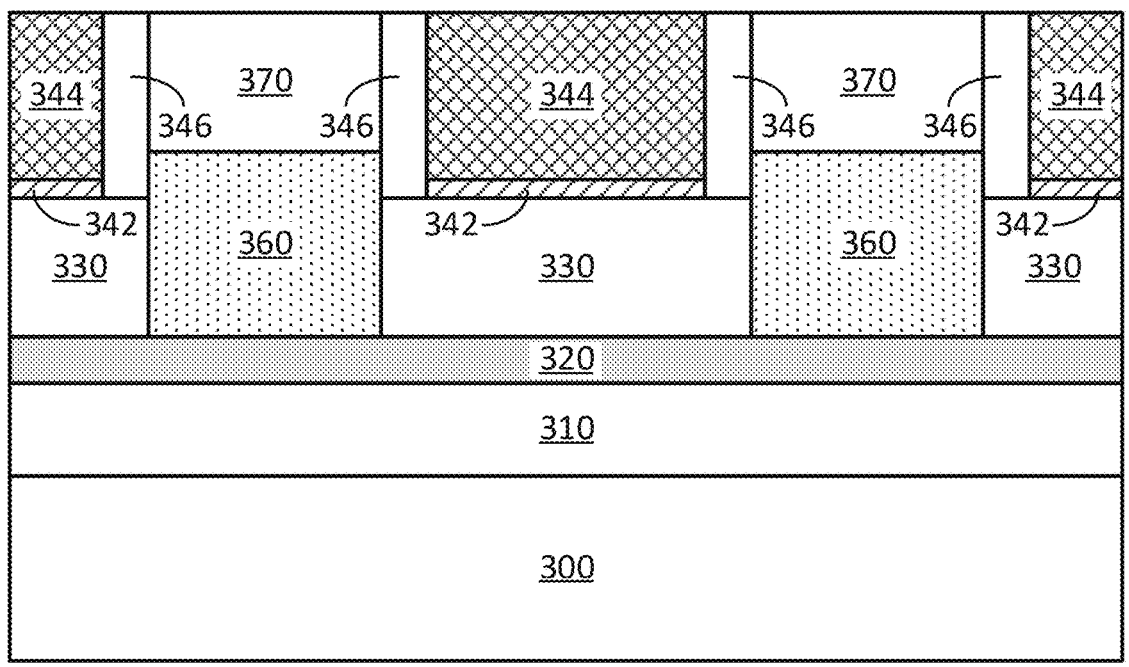
Figure 3G:
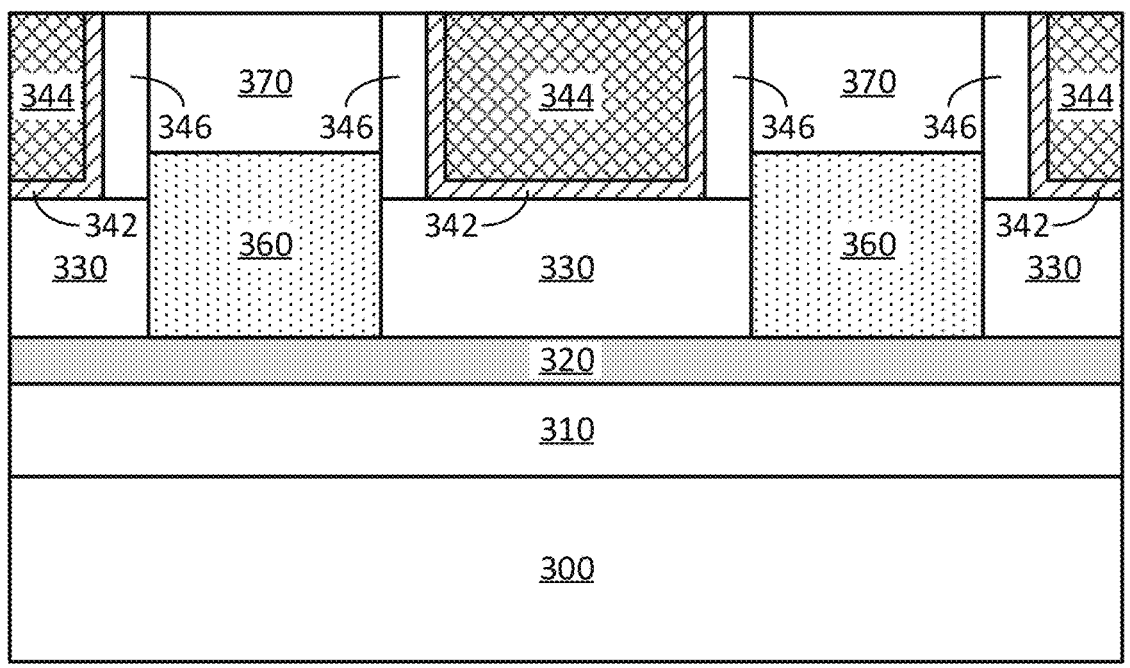
Figure 3H:
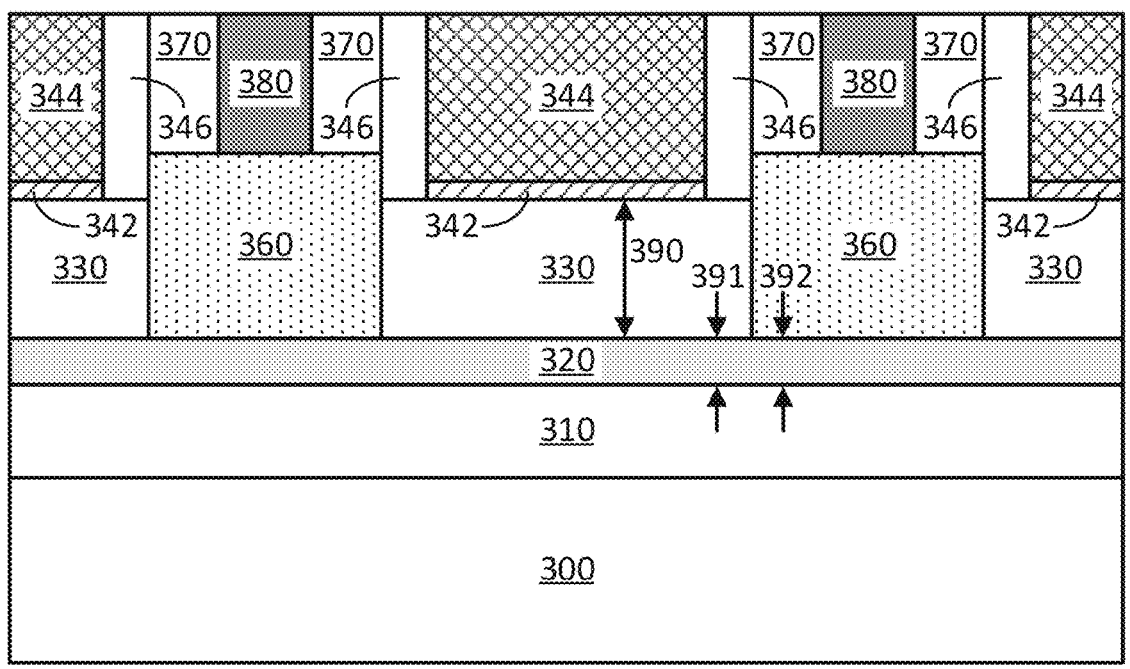
Figure 3H:
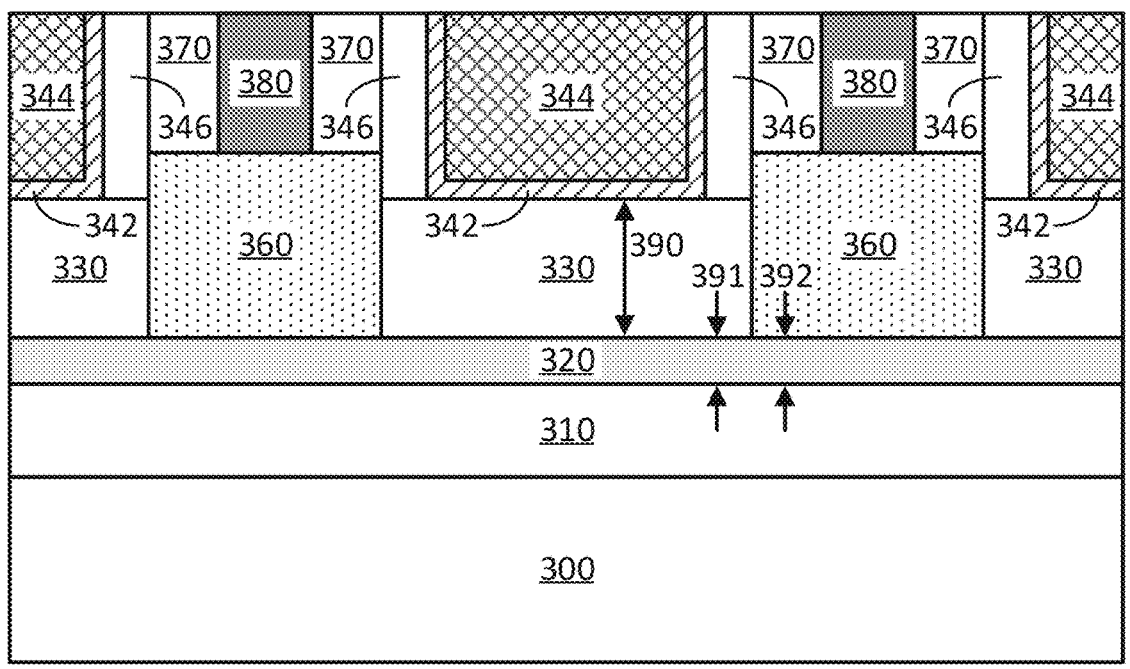

In some embodiments, gate dielectric 342 has a thickness in the range of 1-30 nm (or in a sub-range of 1-5, 1-10, 1-15, 1-20, 1-25, 2-5, 2-10, 2-15, 2-20, 2-25, 2-30, 3-8, 3-12, 5-10, 5-15, 5-20, 5-25, 5-30, 10-20, 10-30, or 20-30 nm) or greater, for example, or within any other suitable range or having any other suitable value as will be apparent in light of this disclosure. In some embodiments, the thickness of gate dielectric 342 is at least 1, 2, 3, 5, 10, 15, 20, or 25 nm, and/or at most 30, 25, 20, 15, 10, 8, or 5 nm, for example. Note that the thicknesses described herein for gate dielectric 342 relate at least to the dimension between the channel layer/body 330 and gate electrode 344 (e.g., at least the dimension in the Y-axis). In embodiments where gate dielectric 342 is also on a sidewall of each of gate spacers 346 (such as is shown in FIG. 3H'), then the thickness is also the dimension between the gate electrode 344 and each of the spacers 346, as can be understood based on this disclosure. In some embodiments, the thickness of gate dielectric 342 is selected, at least in part, based on the desired amount of isolation between channel layer 330 and gate electrode 344.

In some embodiments, gate dielectric 342 provides means for insulating gate electrode 344 from channel layer/body 330. In some embodiments, the characteristics of gate dielectric 342 are selected based on desired electrical properties. For instance, some embodiments employ a relatively thicker gate dielectric (e.g., at least 5 or 10 nm in thickness) and/or relatively lower-k dielectric material for the gate dielectric, such as silicon dioxide or low-k dielectric material (where the dielectric constant, k, is less than that of silicon dioxide, so less than 3.9) to help reduce parasitic capacitance issues caused between adjacent gate electrodes or between gate electrodes and adjacent source/drain contacts, for example. However, in other embodiments, hi-k dielectric material is desired as such material can provide desired electrical properties for some gate configurations.

In some embodiments, gate electrode 344 includes one or more metals, such as one or more of aluminum, tungsten, titanium, tantalum, copper, nickel, gold, platinum, ruthenium, or cobalt, for example. In some embodiments, gate electrode 344 includes carbon and/or nitrogen, such as in combination with one or more of the aforementioned metals, for example. For instance, in some embodiments gate electrode 344 includes titanium and nitrogen (e.g., titanium nitride), or tantalum and nitrogen (e.g., tantalum nitride), such as in a liner layer that is in direct contact with the gate dielectric, for example. Thus, in some embodiments, gate electrode 344 includes one or more metals that may or may not include one or more other materials (such as carbon and/or nitrogen). In some embodiments, gate electrode 344 includes a multilayer structure, including two or more compositionally distinct layers. For instance, in some such embodiments, one or more work function layers are employed, such as one or more metal-including layers that are formed with desired electrical characteristics. Further, in some such embodiments, the one or more metal-including layers include tantalum and/or titanium, which may also include nitrogen (e.g., in the form of tantalum nitride or titanium nitride). In some embodiments, a bulk metal structure is formed on and between a conformal layer (such as a liner layer), where the bulk metal structure includes compositionally distinct material from the conformal/liner layer. In some such embodiments, the conformal/liner layer would be "U" shaped, for example.

In some embodiments, gate electrode 344 includes a resistance reducing metal layer between a bulk metal structure and the gate dielectric, for instance. Example resistance reducing metals include, for instance one or more of nickel, titanium, titanium with nitrogen (e.g., titanium nitride), tantalum, tantalum with nitrogen (e.g., tantalum nitride), cobalt, gold, gold with germanium (e.g., gold-germanium), nickel, platinum, nickel with platinum (e.g., nickel-platinum), aluminum, and/or nickel with aluminum (e.g., nickel aluminum), for instance. Example bulk metal structures include one or more of aluminum, tungsten, ruthenium, copper, or cobalt, for instance. In some embodiments, gate electrode 344 includes additional layers, such as one or more layers including titanium and nitrogen (e.g., titanium nitride) and/or tantalum and nitrogen (e.g., tantalum nitride), which can be used for adhesion and/or liner/barrier purposes, for example. In some embodiments, the thickness, material, and/or deposition process of sub-layers within a multilayer gate electrode are selected based on a target application, such as whether the gate electrode is to be used with an n-type body of channel material 330 or a p-type body of channel material 330. In some embodiments, the gate electrode 344 provides means for changing the electrical attributes of the adjacent channel layer/body 330 when a voltage is applied to the gate electrode 344.

In some embodiments, gate electrode 344 has a thickness (dimension in the Y-axis direction in the view of FIG. 3D) in the range of 10-100 nm (or in a sub-range of 10-25, 10-50, 10-75, 20-30, 20-50, 20-75, 20-100, 30-50, 30-75, 30-100, 50-75, or 50-100 nm) or greater, for example, or within any other suitable range or having any other suitable value as will be apparent in light of this disclosure. In an embodiment, gate electrode 344 has a thickness that falls within the sub-range of 20-40 nm. In some embodiments, the thickness gate electrode 344 is at least 10, 15, 20, 25, 30, 40, or 50 nm and/or at most 100, 50, 40, 30, 25, or 20 nm, for example. In some embodiments, gate electrode 344 includes grading (e.g., increasing and/or decreasing) the content/concentration of one or more materials through at least a portion of the structure.

FIG. 3D also shows that sidewall spacers 346, referred to generally as gate spacers (or simply, spacers), are on either side of the gate stack, in the example structure. Such spacers 346 can be formed using any suitable techniques, such as depositing the material of spacers 346 and performing spacer pattern and etch processing, for example. In some embodiments, the spacers 346 can be used to help determine the gate length and/or channel length (dimensions in the X-axis direction), and/or to help with replacement gate processing, for example. In some embodiments, spacers 346 include any suitable oxide (e.g., silicon dioxide), nitride (e.g., silicon nitride), high-k dielectric, low-k dielectric, and/or any other suitable electrically insulating material as will be apparent in light of this disclosure. In some embodiments, spacers 346 include silicon, oxygen, nitrogen, and/or carbon. For instance, in some embodiments, spacers 346 include silicon dioxide, silicon nitride, silicon oxynitride, or carbon-doped silicon dioxide (or other carbon-doped oxides). In some embodiments, it is desired to select material for spacers 346 that has a low dielectric constant and a high breakdown voltage. In some embodiments, spacers 346 include a multilayer structure (e.g., a bilayer structure where the sub-layers are laterally adjacent to each other in the X-axis direction), even though it is illustrated as a single layer in the example structure of FIG. 3D. In some embodiments, spacers 346 and gate dielectric 342 do not include a distinct interface as shown in FIG. 3D, particularly where spacers 346 and gate dielectric 342 include the same material, for example.

Method 200 of FIG. 2 continues with performing 212 source and drain region processing, such as to form the example resulting structure of FIG. 3F that includes source and drain regions 360, in accordance with some embodiments. Note that the source region and the drain region are referred to herein as simply source/drain regions 360 for ease of description, as either of the regions 360 may be the source region thereby making the other region 360 the drain region. In other words, how the transistor device is electrically connected and/or how it operates can dictate which region 360 is the source region and which is the drain region. For instance, in some embodiments, the left source/drain region 360 in the structure of FIG. 3F is the source region and the right source/drain region 360 is the drain region, and vice versa in other embodiments (left region 360 is the drain and right region 360 is the source).

In some embodiments, source/drain regions 360 are formed via removal and replacement processing, where the channel layer 330 is removed in locations where the source/drain regions 360 are to be formed. For instance, such processing is shown in the intermediate example structure FIG. 3E, where source/drain trench etch was performed to form source/drain trenches 350. Such processing can use wet and/or dry etch techniques that selectively removes the material of channel layer 330 relative to the underlying etch-stop layer 320. For instance, as described herein, the material included in channel layer 330 and etch-stop layer 320 can be selected to ensure a desired amount of etch selectivity between the materials, such that channel layer 330 can be removed using one or more etchants at a rate that is relatively faster than the rate that the one or more etchants remove etch-stop layer. To provide a specific example, if channel layer 330 is SiGe and etch-stop layer 320 is Si, then the SiGe material can be etched and removed to the point of the Si material (which acts as an etch stop to significantly slow the removal of material) using various different etchants (e.g., HCL or HF:HNO3:H2O). To provide another specific example, if channel layer 330 is GaAa or InGaAs and etch-stop layer 320 is InP, then the GaAs or InGaAs material can be etched and removed to the point of the InP material (which acts as an etch stop to significantly slow the removal of material) using various different etchants (e.g., H3PO4:H2O2:H2O or H2SO4:H2O2:H2O). Numerous different material combinations and source/drain trench etch processes can be understood based on this disclosure.

In some embodiments, for a given etchant, material included in etch-stop layer 320 is selective to the material included in channel layer 330, such that the given etchant removes the material in channel layer 330 at least 2, 3, 4, 5, 10, 15, 20, 25, 50, or 100 times faster than the given etchant removes the material in etch-stop layer 320. Thus, in some such embodiments, the etch-stop layer 320 can enable the source/drain depth to be well controlled and designed to be placed at locations that limit sub-fin leakage, for example. In some embodiments, no material from etch-stop layer 320 is removed (or at least no significant amount is removed, such as less than 1 nm is removed) during the source/drain trench etch processing, such as is shown in FIG. 3E. However, in other embodiments, some of etch-stop layer 320 is removed during the source/drain trench etch processing, such as is shown in the variation of FIG. 3E'. Other variations to the source/drain trench etch processing, and thus, the final source/drain regions 360, will be apparent in light of this disclosure and described in more detail herein.

Referring back to the example structure of FIG. 3F, in some embodiments, source/drain regions 360 include semiconductor material. In some embodiments, source/drain regions 360 include group IV and/or group III-V semiconductor material. In some embodiments, source/drain regions 360 include the same group-type of semiconductor material that channel layer 330 includes. For instance, in some such embodiments where channel layer 330 includes group IV semiconductor material (e.g., Si, SiGe, Ge), source/drain regions 360 also include group IV semiconductor material. Further, in some such embodiments where channel layer 330 includes group III-V semiconductor material (e.g., GaAs, InGaAs, InP), source/drain regions 360 also include group III-V semiconductor material. In some embodiments, source/drain regions 360 include one or more of silicon, germanium, tin, carbon, indium, gallium, aluminum, arsenic, nitrogen, phosphorous, arsenic, or antimony. For instance, in an example embodiment, source/drain regions 360 include semiconductor material that includes germanium (e.g., in a concentration in the range of 1-100 atomic percent), which may or may not also include silicon (e.g., in the form of Ge or SiGe). In another example embodiment, source/drain regions 360 include gallium and arsenic, which may or may not also include indium (e.g., in the form of GaAs or InGaAs).

In some embodiments, the source/drain regions 360 include the same semiconductor material as one another (e.g., where they are processed simultaneously), while in other embodiments, the source/drain regions 360 include compositionally distinct semiconductor material from one another (e.g., where they are processed separately using masking techniques). Further, in some embodiments, the semiconductor material included in source/drain regions 360 includes dopant, such as n-type and/or p-type dopant. For instance, in some embodiments, both of the source/drain regions 360 include n-type dopant (e.g., in an NMOS device), while in other embodiments, both of the source/drain regions 360 include p-type dopant (e.g., in a PMOS device). In still other embodiments, one of the source/drain regions 360 includes n-type dopant, while the other of the source/drain regions 360 includes p-type dopant, such as in a configuration that employs quantum tunneling (e.g., in a TFET device).

In some embodiments, one or both of source/drain regions 360 include a multilayer structure that includes at least two compositionally distinct material layers or portions. For instance, in some such embodiments employing a multilayer source/drain region, there may be a first portion nearest channel layer/body 330 and a second portion nearest source/drain contact structure 380, where the first and second portions include compositionally different materials. For example, the second portion may include a relatively higher amount of dopant than the second portion, which may help prevent diffusion of undesired dopant into the adjacent channel layer/body 330 and/or help reduce contact resistance. In another example, the first portion includes a first semiconductor material and the second portion includes a second semiconductor material different form the first semiconductor material. For instance, the first portion may include Si or SiGe with a relatively low Ge concentration (e.g., 0-30 atomic percent), while the second portion may include SiGe or Ge with a relatively high Ge concentration (e.g., 30-100 atomic percent). In some embodiments, one or both of source/drain regions 360 include grading (e.g., increasing and/or decreasing) of the concentration of one or more materials within the feature. For example, the atomic percent concentration of a semiconductor compound can be graded or changed throughout at least a portion of a source/drain region 360, such as the concentration of Ge or In in the region. In another example, the concentration of dopant is graded in a source/drain region 360, such as having the concentration be relatively lower near channel layer/body 330 and relatively higher near the corresponding source/drain contact structure 380. This can be achieved by tuning the amount of dopant in the reactant flow (e.g., during an in-situ doping scheme), for example. Further, such a graded configuration can help prevent diffusion of undesired dopant into the channel layer/body 330 and/or help reduce contact resistance, for example.

As shown in FIG. 3F, the bottom surface of source/drain regions 360 is (at least substantially) flat or planar, and more specifically, is (at least substantially) parallel to a top surface of substrate 300. Such a configuration occurs as a result of the use of buried etch-stop layer 320, as the etchant relatively slowly removes (or does not significantly remove at all) the material of that layer 320 when the source/drain etch processing is performed, thereby providing a larger window to ensure that channel layer 330 is sufficiently removed from the source/drain region locations without etching too far down below the active height 390 of the body of channel material such that a pathway for sub-fin leakage is created. In other words, a relatively flat surface remains at the bottom of source/drain trenches 350 shown in FIGS. 3E and 3E'. This can be contrasted with structures that do not employ etch-stop layer 320, which would have a faceted or curved bottom at the bottom of the source/drain regions, as the source/drain trenches formed during replacement source/drain processing would include such a faceted or curved bottom surface, such as is shown in the example structure of FIG. 1. Therefore, the techniques described herein can be detected, at least in some embodiments, based on the flat or planar bottom surface of the source/drain regions 360, for example.

Method 200 of FIG. 2 continues with optionally forming 214 the final gate structures if dummy gate structures were employed in a gate-last process flow, in accordance with some embodiments. Regardless of whether optional process 214 is performed (depending on whether a gate-first or gate-last process flow is employed), a dielectric layer 370 is formed as shown in FIG. 3G, in accordance with some embodiments. Such a dielectric layer 370 not only prepares the structure for source/drain contact processing, but also covers the source/drain regions 360 should replacement gate processing occur. For instance, the example structure of FIG. 3G' illustrates that the dummy gate structure (such as dummy gate structure 344' shown in FIG. 3D') was removed and replaced with the final gate structure, in accordance with some embodiments. The final gate structure or stack still includes gate dielectric 342 and gate electrode 344, which is the same as the gate-first process flow resulting in the example structure of FIG. 3G. However, as the gate-last process flow structure of FIG. 3G' forms the final gate structures in trenches between gate spacers 346 after the removal of the dummy gate structures, the final gate dielectric in FIG. 3G' is not only formed on the bottom of that trench, but also on the trench sidewalls, as shown. As can be understood, gate dielectric is a conformal layer within that trench. Thus, in some embodiments, gate dielectric 342 has a "U" shape such as is shown in FIG. 3G'.

In some embodiments, dielectric layer 370 includes any suitable oxide (e.g., silicon dioxide), nitride (e.g., silicon nitride), high-k dielectric, low-k dielectric, and/or any other suitable electrically insulating material as will be apparent in light of this disclosure. In some embodiments, dielectric layer 370 includes silicon, oxygen, nitrogen, and/or carbon. For instance, in some embodiments, dielectric layer 370 includes silicon dioxide, silicon nitride, silicon oxynitride, or carbon-doped silicon dioxide (or other carbon-doped oxides). In some embodiments, it is desired to select material for dielectric layer 370 that has a low dielectric constant and a high breakdown voltage. In some embodiments, to decrease dielectric constant, the dielectric layer 370 is formed to be intentionally porous, such as including at least one porous carbon-doped oxide (e.g., porous carbon-doped silicon dioxide). In embodiments where dielectric layer 370 is porous, it includes a plurality of pores throughout at least a portion of the layer. In some embodiments, dielectric layer 370 includes a multilayer structure, even though it is illustrated as a single layer in the figures. Note that dielectric layer 370 may be referred to as an interlayer dielectric (ILD) structure, in some cases.

Method 200 of FIG. 2 continues with performing 216 source/drain contact processing, such as to form the example resulting structures of FIGS. 3H and 3H' that include source/drain contact structures 380, in accordance with some embodiments. Note that the source contact structure and the drain contact structure may simply be referred to herein as source/drain contact structures 380 for ease of description, as either of the contact structures 380 may be to the source region thereby making the other contact structure 380 to the drain region. In other words, in some embodiments, the left source/drain region 360 is the source region and thus corresponding contact structure 380 would be the source contact structure, making the right source/drain region 360 the drain region and thus corresponding contact structure 380 would be the drain contact structure, while in other embodiments, the opposite configuration applies, with the source on the right and the drain on the left.

In some embodiments, source/drain contact processing 216 includes forming source/drain contact trenches in dielectric layer 370 (over the respective source/drain regions 360) and then forming the source/drain contact structures 380 in the trenches. In some embodiments, the source/drain contact processing 216 includes silicidation, germanidation, and/or III-V-idation to form a mixture of one or more metals with the exposed semiconductor material surface of the source/drain regions 360. In some cases, the mixture of the metal and semiconductor material is referred to as an intermetallic region. In some embodiments, one or both of the source/drain contact structures 380 include a resistance reducing metal and a contact plug metal, or just a contact plug, for instance. Example contact resistance reducing metals include, for instance, nickel, titanium, titanium with nitrogen (e.g., in the form of titanium nitride), tantalum, tantalum with nitrogen (e.g., in the form of tantalum nitride), cobalt, gold, gold-germanium, nickel-platinum, nickel aluminum, and/or other such resistance reducing metals or alloys. Example contact plug metals include, for instance, aluminum, tungsten, ruthenium, or cobalt, although any suitable conductive material could be employed. In some embodiments, additional layers are present in the source/drain contact trenches, where such additional layers would be a part of the source/drain contact structures 380. Examples of additional layers include adhesion layers and/or liner/barrier layers, that include, for example, titanium, titanium with nitrogen (e.g., in the form of titanium nitride), tantalum, and/or tantalum with nitrogen (e.g., in the form of tantalum nitride). Another example of an additional layer is a contact resistance reducing layer between a given source/drain region 360 and its corresponding source/drain contact structure 380, where the contact resistance reducing layer includes semiconductor material and relatively high dopant (e.g., with dopant concentrations greater than 1E19, 1E20, 1E21, 5E21, or 1E22 atoms per cubic cm), for example.

Method 200 of FIG. 2 continues with completing 218 integrated circuit processing, as desired, in accordance with some embodiments. Such additional processing to complete the integrated circuit can include back-end or back-end-of-line (BEOL) processing to form one or more metallization layers and/or to interconnect the devices formed during the front-end or front-end-of-line (FEOL) processing, such as the transistor devices described herein. Note that the processes 202-218 of method 200 are shown in a particular order for ease of description, in accordance with some embodiments. However, one or more of the processes 202-218 can be performed in a different order or need not be performed at all, in other embodiments. For example, box 204 is an optional process that need not be performed, in some embodiments. Further, box 214 is an optional process that need not be performed in embodiments employing a gate-first process flow. Numerous variations on method 200 and the techniques described herein will be apparent in light of this disclosure.

Figure 4:
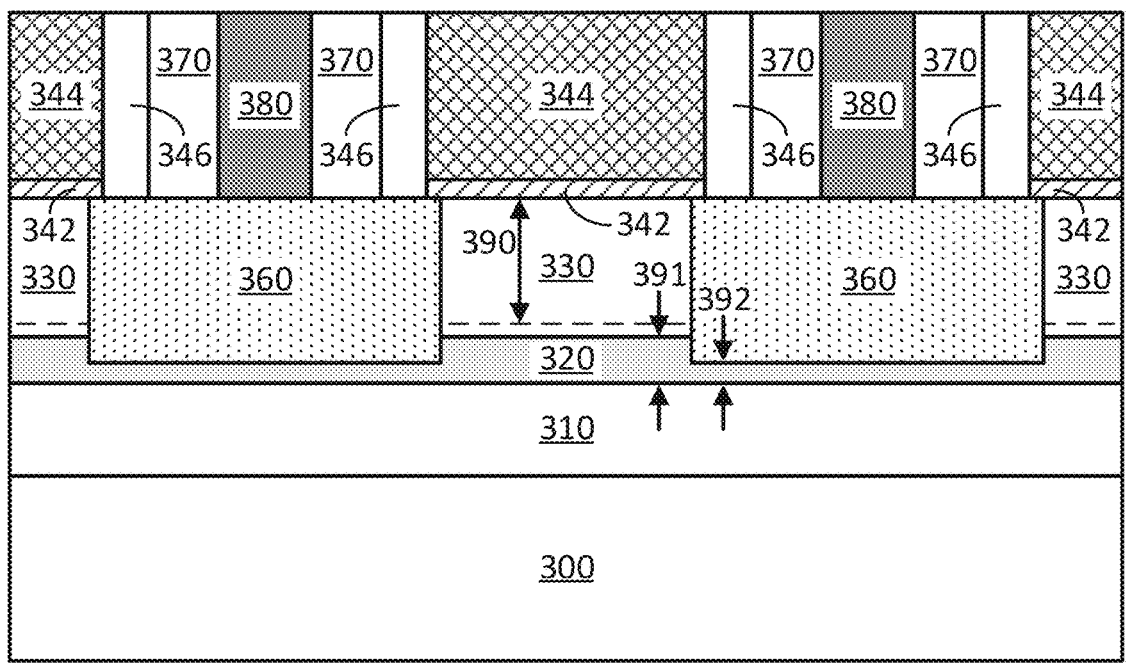
FIG. 4 illustrates the example integrated circuit structure of FIG. 3H employing a buried etch-stop layer and a gate-first process flow, and having relative variations to the structure, in accordance with some embodiments.
Figure 4:
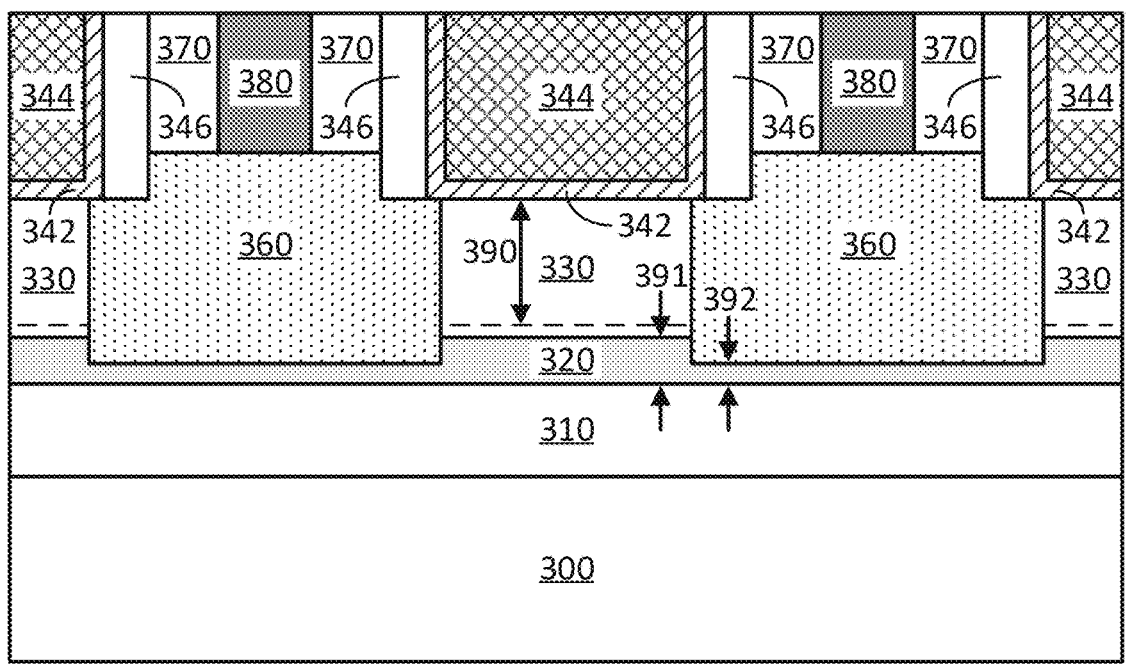
Figure 5:
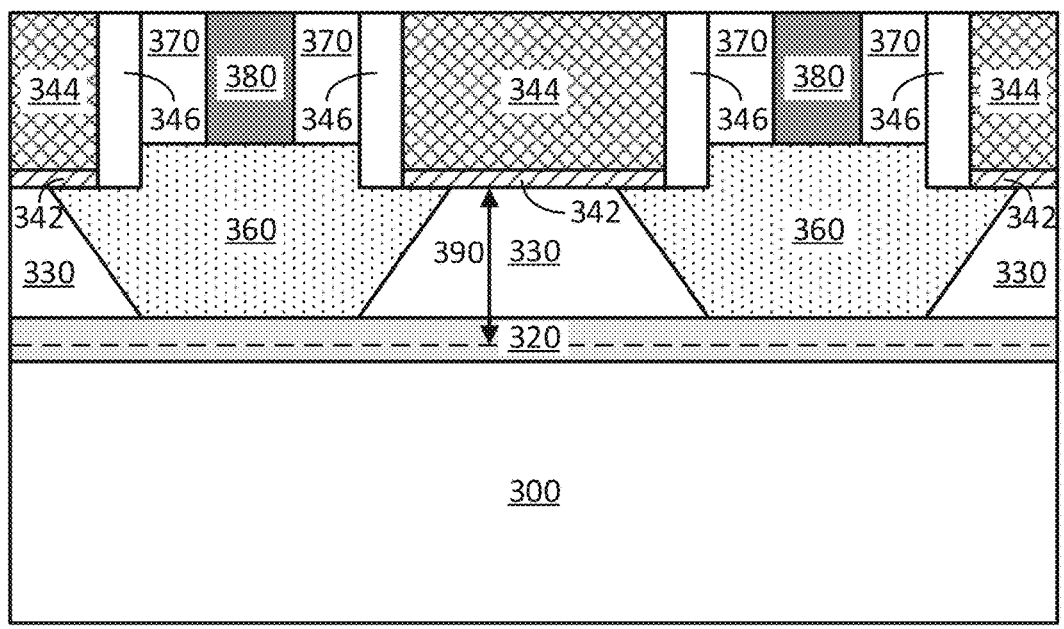
FIG. 5 illustrates the example integrated circuit structure of FIG. 3H employing a buried etch-stop layer and a gate-first process flow, and having relative variations to the structure, in accordance with some embodiments.

FIG. 4 illustrates the example integrated circuit structure of FIG. 3H employing a buried etch-stop layer and a gate-first process flow, and having relative variations to the structure, in accordance with some embodiments. FIG. 4' illustrates the example integrated circuit structure of FIG. 3H' employing a buried etch-stop layer and a gate-last process flow, and having relative variations to the structure, in accordance with some embodiments. FIG. 5 illustrates the example integrated circuit structure of FIG. 3H employing a buried etch-stop layer and a gate-first process flow, and having relative variations to the structure, in accordance with some embodiments. Understandably, the example structures in FIGS. 4, 4', and 5 are similar to their corresponding structures (e.g., in FIGS. 3H and 3H'), except that the buried etch-stop layers 320 and source/drain regions 360 include variations between the structures, as described in more detail below.

One such variation, for instance, is that the buried etch-stop layer 320 in FIGS. 3H and 3H' was not significantly removed in the source/drain trench 350 locations, such that the thickness 392 of the etch-stop layer 320 below the source/drain regions 360 is the same as (or substantially the same as, such as within 1 nm) the thickness 391 of the etch-stop layer 320 below the channel layer (or body of channel material) 330, as shown. Note that thickness 391 is the dimension of etch-stop layer 320 between channel layer (or body) 330 and substrate 300, while thickness 392 is the dimension of etch-stop layer 320 between one or both of the source/drain regions 360 and substrate 300. However, in the example structures of FIGS. 4 and 4', the source/drain etch processing removed at least a significant portion (e.g., at least 1 nm) of etch-stop layer 320 when forming the source/drain trenches 350 (such as is shown in FIG. 3E'). The previous relevant description with respect to the thickness of etch-stop layer 320 is equally applicable to thicknesses 391 and 392. However, in embodiments where at least a significant portion (e.g., at least 1 nm) of etch-stop layer 320 is removed when performing the source/drain trench etching, thickness 392 of etch-stop layer 320 is at least 1, 2, 3, 4, 5, 8, 9, 10, 12, or 15 nm less than thickness 391 of etch-stop layer 320. In some embodiments, only a small portion of etch-stop layer 320 remains at thickness 392, such as only 1, 2, or 3 nm of the layer. In some embodiments, the etch-stop layer 320 is completely removed under the source/drain regions 360, such that thickness 392 is 0. In some such embodiments, use of etch-stop layer 320 can be detected by observing the layer 320 elsewhere in the integrated circuit structure, such as under features that it would not otherwise be present under, such as below the STI regions or below non-processed/blank source/drain locations (e.g., between devices or on un-processed portions of the IC).

Another variation between the example structures of FIGS. 4 and 4' compared to the example structures of FIGS. 3H and 3H' is that the active height 390 of the channel layer (or body) 330 extends all the way to etch-stop layer 320 in the structures of FIGS. 3H and 3H', while it does not extend all the way to etch-stop layer 320 in the structures of FIGS. 4 and 4' (as indicated by the dashed line showing where the gate structure/STI interface is located). Note that body of channel material 330 in these example structures is a fin and has an active height 390 that is also indicated in the example structure of FIG. 7A and is the height of the fin that is between portions of the gate structure (e.g., between portions of gate electrode 344, in this example case). In other words, height 390 relates to the height of the portion of the fin that extends above the top plane of the isolation regions 305 (which may be referred to as shallow trench isolation (STI) regions, in some cases).

In some embodiments, the top surface of the etch-stop layer 320 below body of channel material 330 (e.g., at least a portion of thickness 392) is not a part of the active height 390 of the channel region (e.g., as shown in FIGS. 4 and 4'), is a part of the active height 390 of the channel region (e.g., as shown in FIG. 5), or is just at the bottom interface of the active height 390 of the channel region (e.g., as shown in FIGS. 3H and 3H'). In embodiments where a portion of thickness 392 of etch-stop layer 320 is a part of the active height 390 of the channel region (e.g., as shown in FIG. 5), 1-10 nm (or 1-5 nm) of the layer may be included, for example. In embodiments where no portion of thickness 392 of etch-stop layer 320 is a part of the active height 390 of the channel region (e.g., as shown in FIGS. 4 and 4'), there may be a distance of 1-10 nm (or 1-5 nm) between the bottom interface of that active height 390 and the top surface of etch-stop layer 320 (e.g., between the top surface of an adjacent STI region and the top surface of etch-stop layer 320). Some such embodiments may be desired to ensure that the etch-stop layer 320 is not a part of the active height 390 of the channel region (e.g., where the heterointerface between the channel layer 330 and etch-stop layer 320 is not a part of the active height 390 of the channel region).

Other variations shown in the example structures of FIGS. 4 and 4' include the configuration or shape of the source/drain regions 360. For instance, the source/drain regions in FIGS. 3H and 3H' are raised, such that the top surface of the source/drain regions is higher than the bottom surface of the gate structure (e.g., higher than the bottom surface of gate dielectric 342, and in some embodiments, also higher than the bottom surface of gate electrode 344, such as is shown in FIGS. 3H and 3H'). In addition, the source/drain regions 360 in the example structures of FIGS. 4 and 4' do not extend under gate spacers 346. In the example structure of FIG. 4, the source/drain regions 360 are not raised as shown (e.g., they do not extend above the bottom surface of the gate spacers 346), but they do extend below the gate spacers 346 into what may be referred to as source/drain tip regions. Further, in the example structure of FIG. 4, the source/drain regions 360 extend under the gate structure, such that the source/drain regions 360 are below both gate dielectric 342 and gate electrode 344. Such extended source/drain regions 360 are also shown in FIG. 4', except that those regions do not extend to below gate electrode 344 as shown. Note that although the source/drain regions 360 that extend below the gate structures in FIGS. 4 and 4' are in direct contact with gate dielectric 342, in other embodiments, a source/drain region may extend below the gate structure but not be in direct contact with the gate dielectric 342, for example. The example structure of FIG. 5 shows yet another source/drain region 360 configuration. Numerous variations to the integrated circuit structures described herein will be apparent in light of this disclosure.

Figure 6:
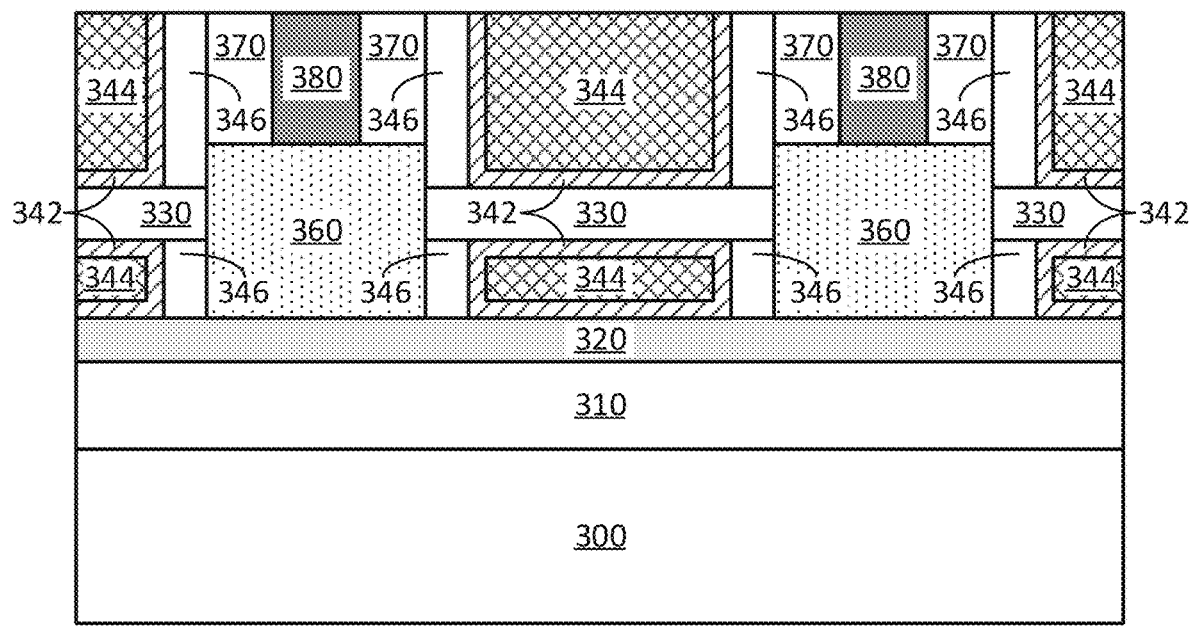
FIG. 6 illustrates a cross-sectional view of an example integrated circuit structure including a buried etch-stop layer and employing a gate-all-around configuration, in accordance with some embodiments.

FIGS. 6 and 7A-B illustrate how the integrated circuit structures employing a buried etch-stop layer that are described herein can have non-planar configurations, in accordance with some embodiments. Planar configurations of the structures described herein relate to where the gate structure (e.g., gate dielectric 342 and gate electrode 344) is only above or otherwise adjacent to only one side of channel layer or body 330. Non-planar configurations of the structures described herein relate to where the gate structure (e.g., gate dielectric 342 and gate electrode 344) is adjacent to multiple sides of channel layer or body 330.

FIG. 6 illustrates a cross-sectional view of an example integrated circuit structure including a buried etch-stop layer and employing a gate-all-around configuration, in accordance with some embodiments. Understandably, this structure is similar to the structure of FIG. 3H', and thus all relevant description of that structure applies equally to the structure of FIG. 6. However, as shown in FIG. 6, the gate structure (including gate dielectric 342 and gate electrode 344) wraps around body 330 in a gate-all-around (GAA) configuration. Thus, in this example structure, body 330 may be considered a nanowire or nanoribbon, for example. Such a structure is also shown in FIG. 7A as body 331, for example. Such a structure can be formed using an initial multilayer stack including one or more sacrificial layers and one or more non-sacrificial layers (such as the layer that becomes body 330). The sacrificial layer(s) of the multilayer stack can then be removed via selective etch processing to release the non-sacrificial layer(s) to be used as the body(ies) of channel material. Thus, the material of sacrificial layer(s) be selectively etched relative to the material of body 330 using a given etchant. Such selective etch processing can occur, for example, during process 214 where the replacement gate processing occurs. Examples of suitable materials for the selective etch processing are provided herein.

In some embodiments employing a gate-all-around or GAA configuration, the nanowire/nanoribbon-shaped body (330 in FIGS. 6 and 331 in FIG. 7A) has a height (in the Y-axis direction) in the range of 2-100 nm (or in a subrange of 2-10, 2-25, 2-40, 2-50, 2-75, 4-10, 4-25, 4-40, 4-50, 4-75, 4-100, 10-25, 10-40, 10-50, 10-75, 10-100, 25-40, 25-50, 25-75, 25-100, or 50-100 nm) or greater, or any other suitable range as will be apparent in light of this disclosure. In some embodiments, the nanowire/nanoribbon-shaped body has a height of at least 2, 5, 8, 10, 15, 20, 25, or 50 nm, and/or a height of at most 100, 75, 50, 40, 30, 25, 20, 15, 12, or 10 nm, for example. Although only one body (or nanowire or nanoribbon) is shown in the example structure of FIG. 6, and also for channel region 331 in the structure of FIG. 7A, any number of bodies (or nanowires or nanoribbons) can be employed in a gate-all-around configuration, such as 2-10 or more, in accordance with some embodiments. For instance, channel region 331 in the structure of FIG. 7A illustrates a gate-all-around configuration employing two nanowires or nanoribbons. In some embodiments, a nanowire or nanoribbon may be considered fin-shaped. In some embodiments, a nanoribbon may have a height to width ratio as described for the fins herein, but inversed, such that a nanoribbon is similar to a sideways laying fin (e.g., with a width to height ratio of at least 1.5, 2, 2.5, 3, 4, or 5).

FIGS. 7A-B illustrate perspective views of an example integrated circuit structure including a buried etch-stop layer and illustrating multiple non-planar configurations, in accordance with some embodiments. Note that the structures of FIG. 7A-B includes similar features to the structure of FIG. 3H, and thus, all previous relevant description is equally applicable to those features in FIGS. 7A-B. Also note that FIG. 7A illustrates the structure prior to source/drain contact structure 380 formation to assist with illustrating the different non-planar channel regions, while FIG. 7B illustrates the structure after the source/drain contact structures 380 have been formed. Further note that the dielectric layer 370 is shown as transparent to allow the underlying features to be shown, as is the gate structure in FIG. 7A. In the example structure of FIG. 7A, four different non-planar channel regions are shown. All of the channel regions include the material of channel layer 330 described herein, where that material is indicated with patterned features including diagonal lines.

The first channel region in the example structure of FIG. 7A includes fin-shaped body of channel material 330. All previous relevant description with respect to channel layer or body of channel material 330 is equally applicable to fin-shaped body 330. Moreover, in some embodiments, body 330 in FIGS. 3H, 3H', 4, 4', and 5 is a fin-shaped body, where the active height 390 is indicated, as it is indicated in the structure of FIG. 7A. Recall that the active height 390 of the channel region is the height of the fin that is between portions of the gate structure (e.g., between portions gate electrode 344). In other words, height 390 relates to the height of the portion of the fin that extends above the top plane of the isolation regions 305 (which may be referred to as shallow trench isolation (STI) regions, in some cases). The second and third channel regions 331 and 332 in the example structure of FIG. 7A include a gate-all-around (GAA) configuration, where the bodies of channel material may be considered nanowires or nanoribbons, as previously explained. The fourth channel region 333 in the example structure of FIG. 7A is yet another example non-planar transistor channel region configuration, which is a hybrid between a finned channel region and a GAA channel region, where the sacrificial material (shown with grey shading) that would otherwise be completely removed to release nanowires in a GAA configuration was instead only partially removed to form the resulting beaded-fin structure 333 shown. Such a beaded-fin channel region structure may benefit from, for instance, increased gate control (e.g., compared to a finned channel region structure) while also having, for instance, relatively reduced parasitic capacitance (e.g., compared to a GAA channel region structure). Note that the four channel regions are being shown in one continuous structure for ease of illustration; however, in some embodiments, a single channel region configuration is chosen for a given integrated circuit area, such as forming all of the transistor devices with finned channel regions or GAA channel regions, for example.

In embodiments employing a finned configuration (e.g., where the body is a fin, such as fin 301), the fins can be formed using any suitable techniques, such as blanket depositing the body of channel material and patterning the blanket-deposited layer into fins as desired. Another technique includes forming fins in the top of substrate 300, forming isolation regions including dielectric material in the trenches between fins, recessing or removing the substrate-based fins to make trenches between the isolation regions, depositing the material of body to form fins in those trenches, and then recessing the isolation regions to expose the fins and allow them to protrude or extend above a top surface of the isolation regions. For instance, isolation regions 305 would be those recessed isolation regions in such cases. Regardless, in some embodiments, isolation regions (or STI regions) 305 include dielectric material. In some such embodiments, the dielectric material included in isolation regions 305 includes any suitable oxide (e.g., silicon dioxide), nitride (e.g., silicon nitride), high-k dielectric, low-k dielectric, and/or any other suitable electrically insulating material as will be apparent in light of this disclosure. In some embodiments, isolation regions 305 include silicon, oxygen, nitrogen, and/or carbon. For instance, in some embodiments, isolation regions 305 includes silicon dioxide, silicon nitride, silicon oxynitride, or carbon-doped silicon dioxide (or other carbon-doped oxides).

In some embodiments employing a finned configuration, the fin-shaped body (e.g., 330) has a width (dimension in the Z-axis direction) in the range of 2-100 nm (or in a subrange of 2-10, 2-25, 2-40, 2-50, 2-75, 4-10, 4-25, 4-40, 4-50, 4-75, 4-100, 10-25, 10-40, 10-50, 10-75, 10-100, 25-40, 25-50, 25-75, 25-100, or 50-100 nm) or greater, or any other suitable range as will be apparent in light of this disclosure. In some embodiments, the fin-shaped body has a width of at least 2, 5, 8, 10, 15, 20, 25, or 50 nm, and/or a width of at most 100, 75, 50, 40, 30, 25, 20, 15, 12, or 10 nm, for example. In some embodiments employing a finned configuration, the active height 390 of the fin-shaped body is a height (dimension in the Y-axis direction) in the range of 5-200 nm (or in a subrange of 5-25, 5-50, 5-100, 10-25, 10-50, 10-80, 10-100, 10-200, 20-80, 20-100, 20-200, 40-80, 40-120, 40-200, 50-100, 50-200, or 100-200 nm) or greater, or any other suitable range as will be apparent in light of this disclosure. In some embodiments, the fin-shaped body has an active height 390 of at least 5, 10, 15, 20, 25, 50, 80, 100, 120, or 150 nm, and/or at most 200, 150, 120, 100, 80, 50, or 25 nm, for example. In some embodiments employing a finned configuration, the active height 390 to width ratio of the fins is greater than 1, such as greater than 1.5, 2, 2.5, 3, 4, 5, 6, 7, 8, 9, or 10, or greater than any other suitable threshold ratio. Numerous variations and configurations will be apparent in light of this disclosure.

Example System

Figure 8:
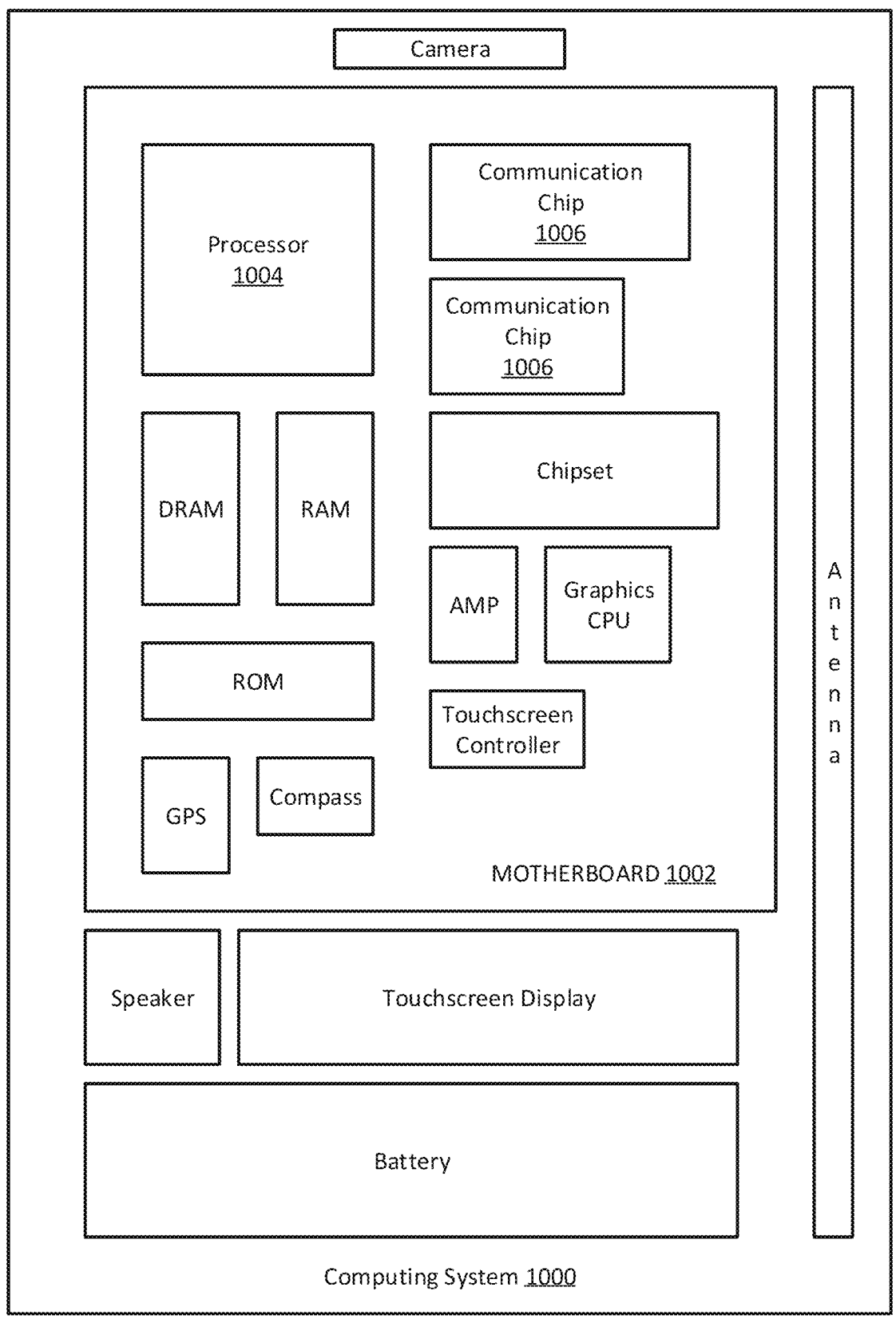
FIG. 8 illustrates a computing system implemented with integrated circuit structures including a buried etch-stop layer as disclosed herein, in accordance with some embodiments.

FIG. 8 illustrates a computing system 1000 implemented with integrated circuit structures including a buried etch-stop layer as disclosed herein, in accordance with some embodiments. For example, the integrated circuit structures disclosed herein including at least one transistor with the buried etch-stop layer can be included in one or more portions of computing system 1000. As shown, the computing system 1000 houses a motherboard 1002. The motherboard 1002 can include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 can include one or more other components that may or may not be physically and electrically coupled to the motherboard 1002. These other components can include, but are not limited to, volatile memory (e.g., DRAM or other types of RAM), non-volatile memory (e.g., ROM, ReRAM/RRAM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 can include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 can implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 can include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also can include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability can be integrated directly into the processor 1004 (e.g., where functionality of any chips 1006 is integrated into processor 1004, rather than having separate communication chips). Further note that processor 1004 can be a chip set having such wireless capability. In short, any number of processor 1004 and/or communication chips 1006 can be used. Likewise, any one chip or chip set can have multiple functions integrated therein.

In various implementations, the computing system 1000 can be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit including at least one transistor. The integrated circuit includes a substrate, a body (or channel region), a gate electrode and a gate dielectric (or, collectively, a gate structure), a source (or first) region and a drain (or second) region, and a layer between the body (or channel region) and the substrate. The body is above the substrate and includes semiconductor material. The gate electrode is at least above the body and includes one or more metals. The gate dielectric is between the gate electrode and the body, the gate dielectric including one or more dielectrics. The body is between the source and drain regions (and/or the source and drain regions are adjacent the body), the source and drain regions including semiconductor material. The layer includes compositionally different material from the body.

Example 2 includes the subject matter of Example 1, wherein the layer includes semiconductor material that is compositionally different from the semiconductor material included in the body.

Example 3 includes the subject matter of Example 1 or 2, wherein the layer is also between the substrate and the source region.

Example 4 includes the subject matter of any of Examples 1-3, wherein the layer is also between the substrate and the drain region.

Example 5 includes the subject matter of any of Examples 1-4, wherein the substrate is a bulk silicon substrate.

Example 6 includes the subject matter of any of Examples 1-5, wherein the semiconductor material included in the body includes germanium.

Example 7 includes the subject matter of Example 6, wherein the semiconductor material included in the body further includes silicon.

Example 8 includes the subject matter of any of Examples 1-5, wherein the semiconductor material included in the body includes group III-V semiconductor material.

Example 9 includes the subject matter of Example 8, wherein the group III-V semiconductor material included in the body includes one or more of arsenic, phosphorous, nitrogen, antimony, or bismuth.

Example 10 includes the subject matter of Example 8 or 9, wherein the group III-V semiconductor material included in the body includes one or more of aluminum, gallium, or indium.

Example 11 includes the subject matter of any of Examples 1-10, wherein the semiconductor material included in the layer includes silicon.

Example 12 includes the subject matter of any of Examples 1-11, wherein the semiconductor material included in the layer is silicon (that does or does not include dopant).

Example 13 includes the subject matter of any of Examples 1-12, wherein the layer includes a thickness between the substrate and the body of 1 to 20 nanometers.

Example 14 includes the subject matter of any of Examples 1-13, wherein the layer includes a thickness between the substrate and the body of 1 to 10 nanometers.

Example 15 includes the subject matter of any of Examples 1-14, wherein the layer is relatively thicker between the substrate and the body than between the substrate and the source region.

Example 16 includes the subject matter of any of Examples 1-15, wherein the layer is at least 1, 2, 3, 4, 5, or 10 nanometers thicker between the substrate and the body than between the substrate and the source region.

Example 17 includes the subject matter of any of Examples 1-16, wherein, for a given etchant, the semiconductor material included in the body has a higher etch rate than an etch rate for the semiconductor material included in the layer.

Example 18 includes the subject matter of any of Examples 1-17, for a given etchant, the semiconductor material included in the body has an etch rate that is at least 2, 3, 4, 5, 10, or 20 times greater than an etch rate for the semiconductor material included in the layer.

Example 19 includes the subject matter of any of Examples 1-18, wherein the body is a fin, the fin between two portions of the gate electrode.

Example 20 includes the subject matter of Example 19, wherein the fin has a height of at least 20, 35, 50, 100, 150, or 200 nanometers between the two portions of the gate electrode.

Example 21 includes the subject matter of any of Examples 1-18, wherein the gate electrode wraps around the body. In some such cases, the body is a nanowire or nanoribbon.

Example 22 is a computing system comprising the subject matter of any of Examples 1-21.

Example 23 is an integrated circuit including at least one transistor. The integrated circuit includes a substrate, a body (or channel region), a gate electrode and a gate dielectric (or, collectively, a gate structure), a source (or first) region and a drain (or second) region, a first layer, and a second layer. The body is above the substrate and includes semiconductor material. The gate electrode is at least above the body and includes one or more metals. The gate dielectric is between the gate electrode and the body, the gate dielectric including one or more dielectrics. The body is between the source and drain regions (and/or the source and drain regions are adjacent the body), the source and drain regions including semiconductor material. The first layer is between the substrate and the body. The second layer is between the first layer and the body.

Example 24 includes the subject matter of Example 23, wherein the first layer is between the substrate and the source region.

Example 25 includes the subject matter of Example 23 or 24, wherein the first layer is between the substrate and the drain region.

Example 26 includes the subject matter of Example 25, wherein the first layer is continuous from between the substrate and the source region to between the substrate and the drain region.

Example 27 includes the subject matter of any of Examples 23-26, wherein the first layer includes the semiconductor material that is included in the body.

Example 28 includes the subject matter of any of Examples 23-26, wherein the first layer includes compositionally different material from the body.

Example 29 includes the subject matter of any of Examples 23-28, wherein the first layer includes compositionally different material from the substrate.

Example 30 includes the subject matter of any of Examples 23-29, wherein the second layer includes semiconductor material that is compositionally different from the semiconductor material included in the body.

Example 31 includes the subject matter of any of Examples 23-30, wherein the second layer is also between the substrate and the source region.

Example 32 includes the subject matter of any of Examples 23-31, wherein the second layer is also between the substrate and the drain region.

Example 33 includes the subject matter of any of Examples 23-32, wherein the substrate is a bulk silicon substrate.

Example 34 includes the subject matter of any of Examples 23-33, wherein the semiconductor material included in the body includes germanium.

Example 35 includes the subject matter of Example 34, wherein the semiconductor material included in the body further includes silicon.

Example 36 includes the subject matter of any of Examples 23-33, wherein the semiconductor material included in the body includes group III-V semiconductor material.

Example 37 includes the subject matter of Example 36, wherein the group III-V semiconductor material included in the body includes one or more of arsenic, phosphorous, nitrogen, antimony, or bismuth.

Example 38 includes the subject matter of Example 36 or 37, wherein the group III-V semiconductor material included in the body includes one or more of aluminum, gallium, or indium.

Example 39 includes the subject matter of any of Examples 23-38, wherein the semiconductor material included in the second layer includes silicon.

Example 40 includes the subject matter of any of Examples 23-39, wherein the semiconductor material included in the second layer is silicon (that does or does not include dopant).

Example 41 includes the subject matter of any of Examples 23-40, wherein the second layer includes a thickness between the first layer and the body of 1 to 20 nanometers.

Example 42 includes the subject matter of any of Examples 23-41, wherein the second layer includes a thickness between the first layer and the body of 1 to 10 nanometers.

Example 43 includes the subject matter of any of Examples 23-42, wherein the second layer is relatively thicker between the first layer and the body than between the first layer and the source region.

Example 44 includes the subject matter of any of Examples 23-43, wherein the second layer is at least 1, 2, 3, 4, 5, or 10 nanometers thicker between the first layer and the body than between the first layer and the source region.

Example 45 includes the subject matter of any of Examples 23-44, wherein, for a given etchant, the semiconductor material included in the body has a higher etch rate than an etch rate for the semiconductor material included in the second layer.

Example 46 includes the subject matter of any of Examples 23-45, for a given etchant, the semiconductor material included in the body has an etch rate that is at least 2, 3, 4, 5, 10, or 20 times greater than an etch rate for the semiconductor material included in the second layer.

Example 47 includes the subject matter of any of Examples 23-46, wherein the body is a fin, the fin between two portions of the gate electrode.

Example 48 includes the subject matter of Example 47, wherein the fin has a height of at least 20, 35, 50, 100, 150, or 200 nanometers between the two portions of the gate electrode.

Example 49 includes the subject matter of any of Examples 23-46, wherein the gate electrode wraps around the body. In some such cases, the body is a nanowire or nanoribbon.

Example 50 is a computing system comprising the subject matter of any of Examples 23-49.

Example 51 is a method of forming the subject matter of any of Examples 1-50. The method includes at least providing the substrate, forming the gate electrode and the gate dielectric (or, collectively, the gate structure), forming the source and drain regions, and forming the (second) layer.

Example 52 includes the subject matter of Example 51, wherein the gate structure is formed by removing a dummy gate structure and replacing it with the gate structure.

Example 53 includes the subject matter of Example 51 or 52, wherein material native to the body is removed via etch processing to form trenches in which the source and drain regions are formed.

Example 54 includes the subject matter of Example 53, wherein the etch processing includes an etchant that removes the material included in the body at a faster rate than the material included in the (second) layer.

Example 55 includes the subject matter of any of Examples 51-54, wherein the source and drain regions are formed prior to forming the gate structure.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including at least one transistor, the integrated circuit comprising:
    a substrate;
    a body above the substrate, the body including semiconductor material, and the body having a lateral width;
    a gate electrode at least above the body, the gate electrode including one or more metals;
    a gate dielectric between the gate electrode and the body, the gate dielectric including one or more dielectrics;
    a source region and a drain region, the body between the source and drain regions, the source and drain regions including a semiconductor material that is compositionally different from the semiconductor material of the body; and
    a layer between the substrate and the body, the layer between the substrate and the source region, the layer between the substrate and the drain region, the layer being continuous from between the substrate and the source region to between the substrate and the drain region, the layer including semiconductor material that is compositionally different from the semiconductor material included in the body and compositionally different from the semiconductor material of the source region and the drain region, wherein the layer is in contact with the semiconductor material of the source region and the drain region, and wherein the layer does not extend layerally beyond the lateral width of the body.

2. The integrated circuit of claim 1, wherein the substrate is a bulk silicon substrate.

3. The integrated circuit of claim 1, wherein the semiconductor material included in the body includes germanium.

4. The integrated circuit of claim 3, wherein the semiconductor material included in the body further includes silicon.

5. The integrated circuit of claim 3, wherein the semiconductor material included in the layer includes silicon.

6. The integrated circuit of claim 1, wherein the semiconductor material included in the body includes group III-V semiconductor material.

7. The integrated circuit of claim 6, wherein the group III-V semiconductor material included in the body includes arsenic.

8. The integrated circuit of claim 6, wherein the group III-V semiconductor material included in the body includes phosphorous.

9. The integrated circuit of claim 1, wherein the layer includes a thickness between the substrate and the body of 1 to 20 nanometers.

10. The integrated circuit of claim 1, wherein the layer is relatively thicker between the substrate and the body than between the substrate and the source region.

11. The integrated circuit of claim 1, wherein, for a given etchant, the semiconductor material included in the body has a higher etch rate than an etch rate for the semiconductor material included in the layer.

12. The integrated circuit of claim 1, wherein the body is a fin, the fin between two portions of the gate electrode.

13. The integrated circuit of claim 12, wherein the fin has a height of at least 20 nanometers between the two portions of the gate electrode.

14. The integrated circuit of claim 1, wherein the gate electrode wraps around the body.

15. The integrated circuit of claim 14, wherein the body is a nanowire or a nanoribbon.

16. A computing system comprising the integrated circuit of claim 1.

17. An integrated circuit including at least one transistor, the integrated circuit comprising:
    a substrate, the substrate being a bulk silicon substrate;
    a body above the substrate, the body including semiconductor material, and the body having a lateral width;
    a gate electrode at least above the body, the gate electrode including one or more metals;
    a gate dielectric between the gate electrode and the body, the gate dielectric including one or more dielectrics;

a source region and a drain region, the body between the source and drain regions, the source and drain regions including semiconductor material and dopant;

a first layer between the substrate and the body, the first layer between the substrate and the source region, the first layer between the substrate and the drain region, the first layer being continuous from between the substrate and the source region to between the substrate and the drain region, the first layer including the semiconductor material that is included in the body; and a second layer between the first layer and the body, the second layer between the first layer and the source region, the second layer between the first layer and the drain region, the second layer being continuous from between the first layer and the source region to between the first layer and the drain region, the second layer being relatively thicker between the first layer and the body than between the first layer and the source region, the second layer including semiconductor material that is compositionally different from the semiconductor material included in the body, wherein the second layer does not extend layerally beyond the lateral width of the body.

18. The integrated circuit of claim 17, wherein the semiconductor material included in the body and the first layer includes germanium, and the semiconductor material included in the second layer includes silicon.

19. A method of forming an integrated circuit including at least one transistor, the method comprising:

providing a substrate;

forming a body above the substrate, the body including semiconductor material, the body having a lateral width;

forming a gate structure at least above the body, the gate structure including a gate electrode and a gate dielectric, the gate dielectric between the gate electrode and the body, the gate electrode including one or more metals, the gate dielectric including one or more dielectrics;

forming a source region and a drain region, the body between the source and drain regions, the source and drain regions including a semiconductor material that is compositionally different from the semiconductor material of the body; and forming a layer between the substrate and the body, the layer between the substrate and the source region, the layer between the substrate and the drain region, the layer being continuous from between the substrate and the source region to between the substrate and the drain region, the layer including semiconductor material that is compositionally different from the semiconductor material included in the body and compositionally different from the semiconductor material of the source region and the drain region, wherein the layer is in contact with the semiconductor material of the source region and the drain region, and wherein the layer does not extend layerally beyond the lateral width of the body.

20. The method of claim 19, wherein the source and drain regions are formed prior to forming the gate structure.

* * * * *